(12) United States Patent
Davison et al.

(10) Patent No.: US 12,261,068 B2
(45) Date of Patent: Mar. 25, 2025

(54) WAFER SUPPORT MEMBER AND METHOD OF MANUFACTURING A WAFER SUPPORT MEMBER

(71) Applicant: Intel Corporation, Santa Clara, CA (US)

(72) Inventors: Peter Davison, Puyallup, WA (US); Paul Gwin, Orangevale, CA (US)

(73) Assignee: INTEL CORPORATION, Santa Clara, CA (US)

( * ) Notice: Subject to any disclaimer, the term of this patent is extended or adjusted under 35 U.S.C. 154(b) by 78 days.

(21) Appl. No.: 17/974,576

(22) Filed: Oct. 27, 2022

(65) Prior Publication Data

US 2024/0145282 A1 May 2, 2024

(51) Int. Cl.
*H01L 21/673* (2006.01)
(52) U.S. Cl.
CPC ................ *H01L 21/6732* (2013.01)
(58) Field of Classification Search
CPC ......... H01L 21/67303; H01L 21/67313; H01L 21/67326; H01L 21/37333; H01L 21/67383; H01L 21/6732; H01L 21/37309; H01L 21/67346; H01L 21/67369; B65D 85/48

USPC ........................ 206/710, 711, 712; 211/41.18
See application file for complete search history.

(56) References Cited

U.S. PATENT DOCUMENTS

| 6,065,615 A * | 5/2000 | Uchiyama ......... H01L 21/67303 211/41.18 |
| 2009/0321372 A1* | 12/2009 | Gilmore ............ H01L 21/67309 211/41.18 |
| 2015/0030416 A1* | 1/2015 | Sakiya .................... E05F 15/47 206/711 |

* cited by examiner

*Primary Examiner* — King M Chu
(74) *Attorney, Agent, or Firm* — VIERING, JENTSCHURA & PARTNER mbB

(57) ABSTRACT

There may be provided a wafer support member which may include a support column and a plurality of wafer-engagement-shelves extending substantially perpendicularly to the support column from a first side of the support column. Each wafer-engagement-shelf may define a plurality of through-holes extending between a base surface and an opposite wafer-engagement surface of the wafer-engagement shelf 130. The plurality of through-holes may serve as discharge ports for a plurality of loose particulates on the wafer-engagement-shelf to exit therefrom via the discharge ports.

20 Claims, 24 Drawing Sheets

… …

WAFER SUPPORT MEMBER AND METHOD OF MANUFACTURING A WAFER SUPPORT MEMBER

TECHNICAL FIELD

Various aspects generally relate to a wafer support member. In particular, various aspects generally relate to one or more wafer support members for supporting a plurality of wafer disks.

BACKGROUND

Wafer disks are typically transported around a semiconductor facility by an automated system. To ensure the structural integrity of the wafer disks are preserved as they are moved around the semiconductor facility, the wafer disks are generally required to be placed on a conventional carrier (i.e. of the automated system).

Such a conventional carrier is typically manufactured via a conventional injection molding process. However, conventional injection molding processes generally involve long lead-time, involve risk that the injection molded part is not flat nor manufacturable if the part is molded as one single piece, and involve high tooling cost due to part complexity and cooling requirements.

Therefore, there may be a need to provide a carrier for wafer disks, which may be simple and fast to manufacture or produce, while being capable of supporting wafer disks thereon, to thereby address the above-mentioned issues.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosure. In the following description, various aspects are described with reference to the following drawings, in which.

Figure 3A:
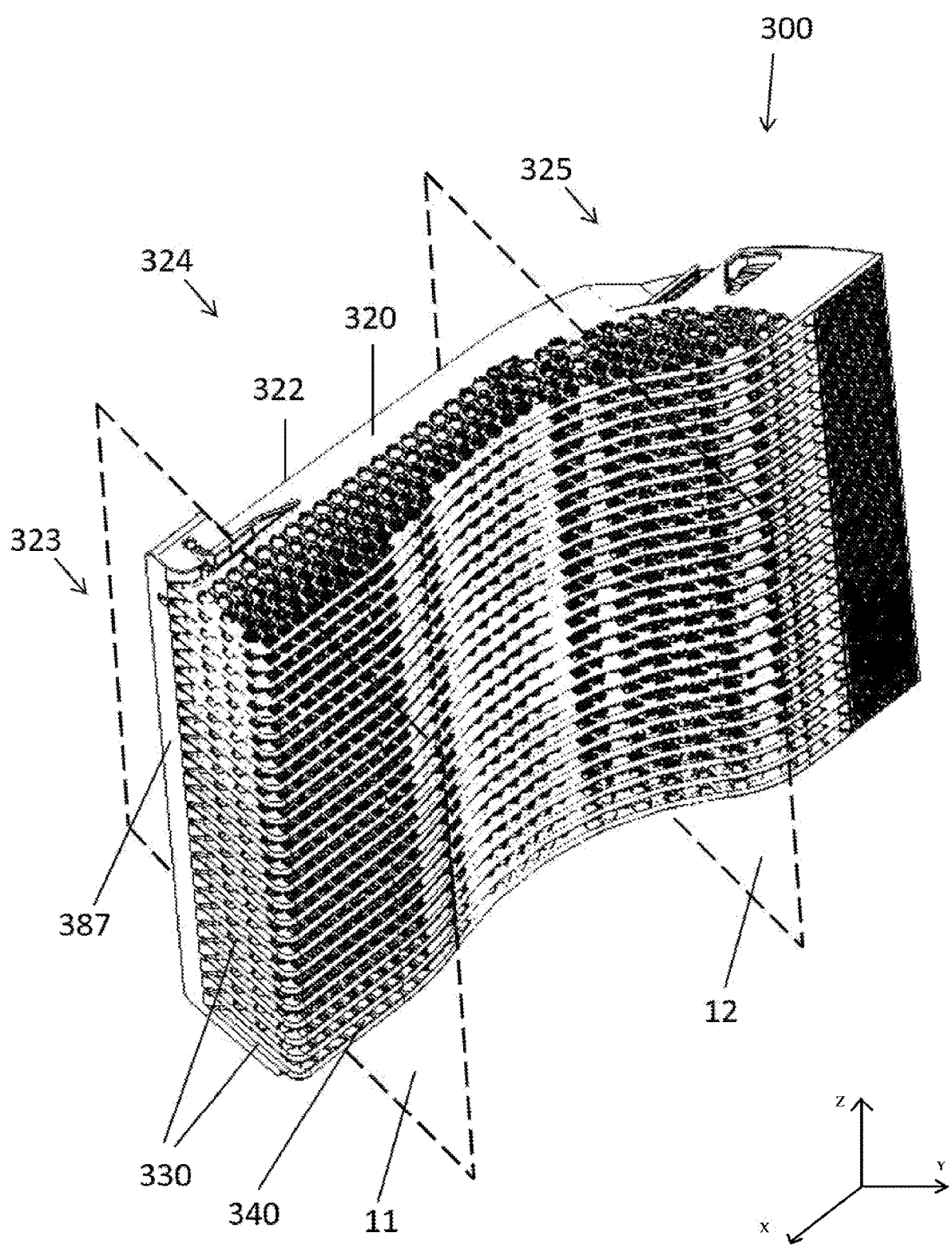
FIG. 3A shows a perspective view of a wafer support member, which includes a support column defining drain holes and a plurality of wafer-engagement-shelves defining through-holes, from a first angle, according to various aspects of the present disclosure.
Figure 3B:
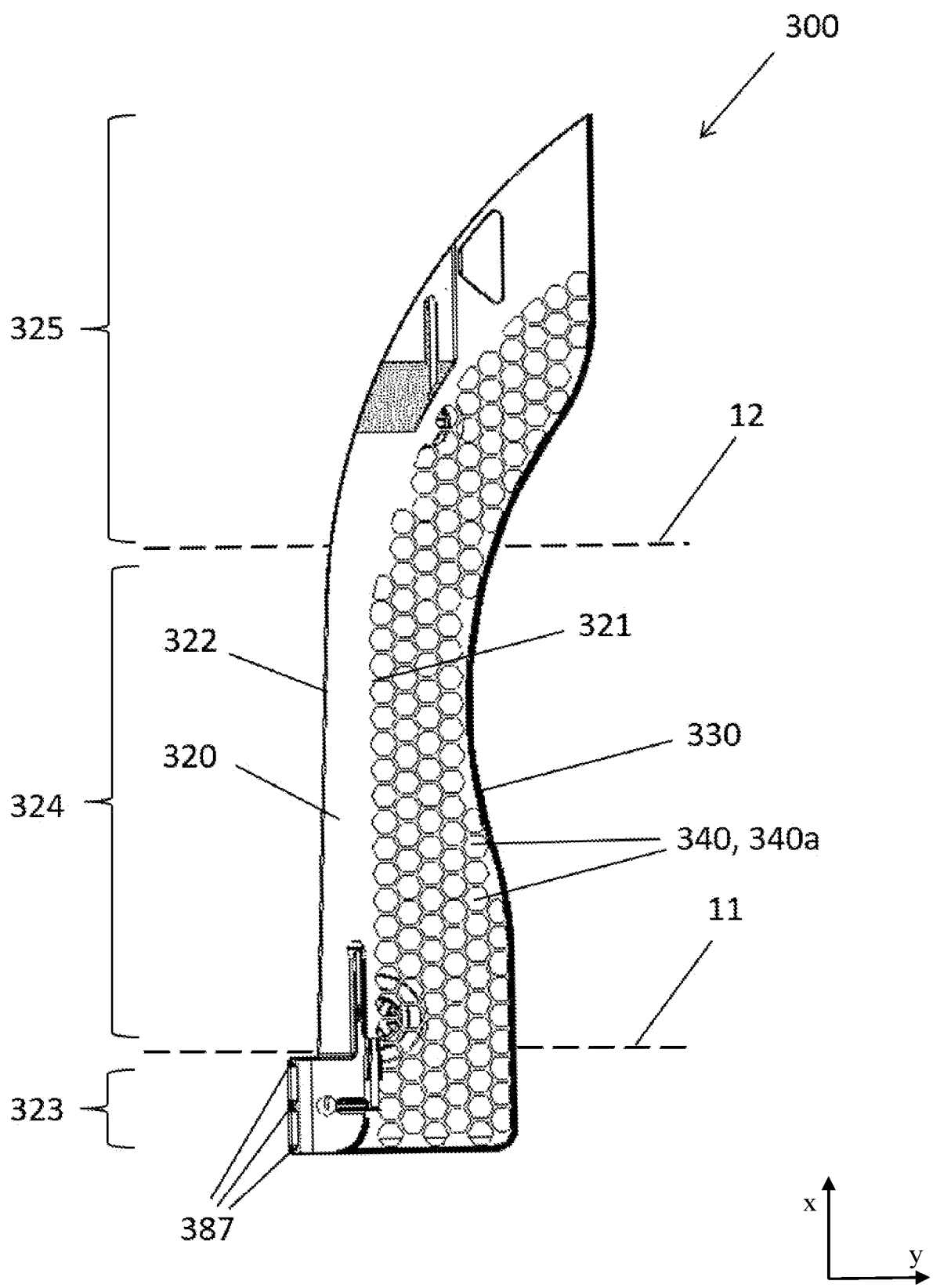
FIG. 3B shows a top view of the wafer support member of FIG. 3A, according to various aspects of the present disclosure.
Figure 3C:
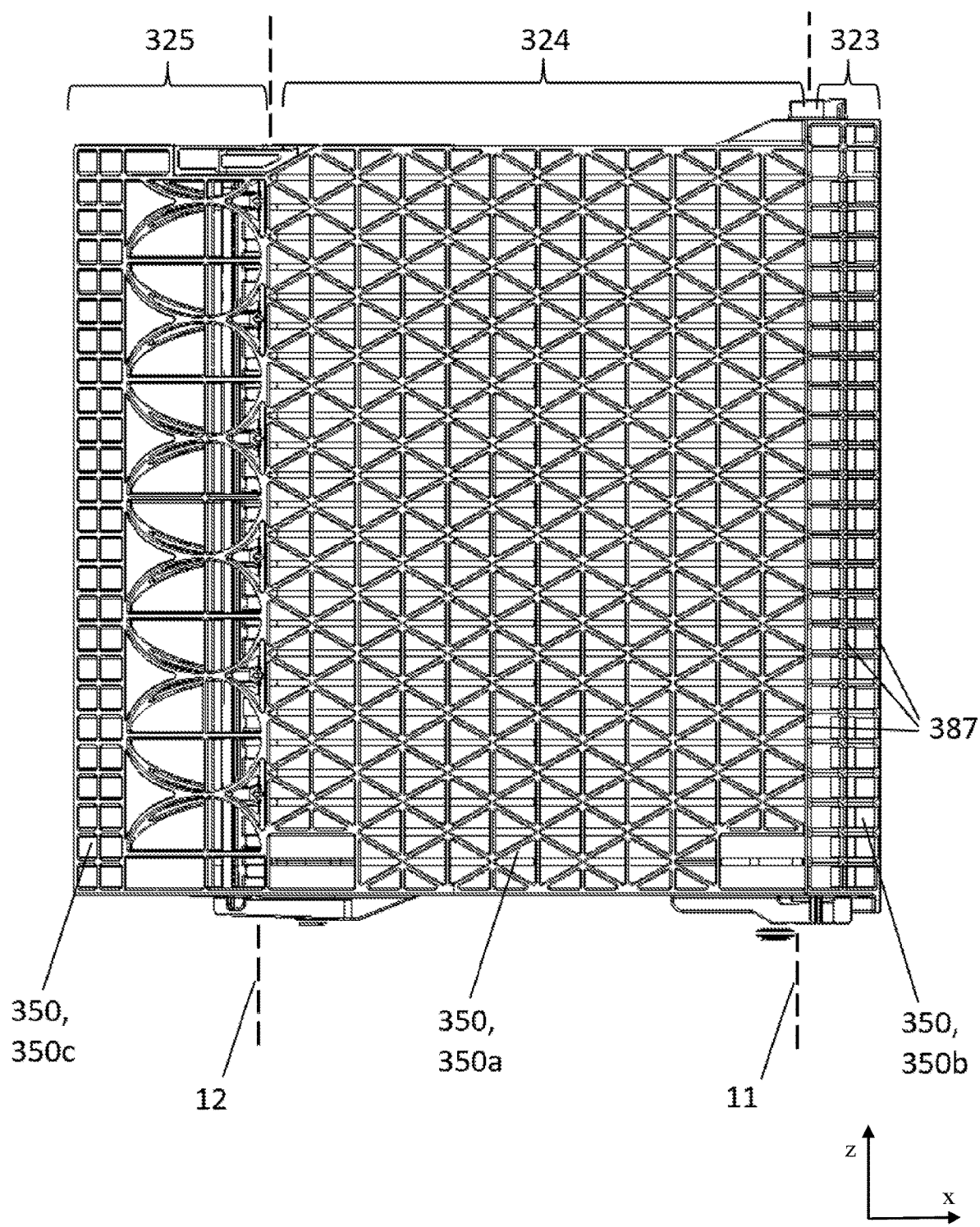
FIG. 3C shows a side view of the wafer support member of FIG. 3A, according to various aspects of the present disclosure.
Figure 3D:
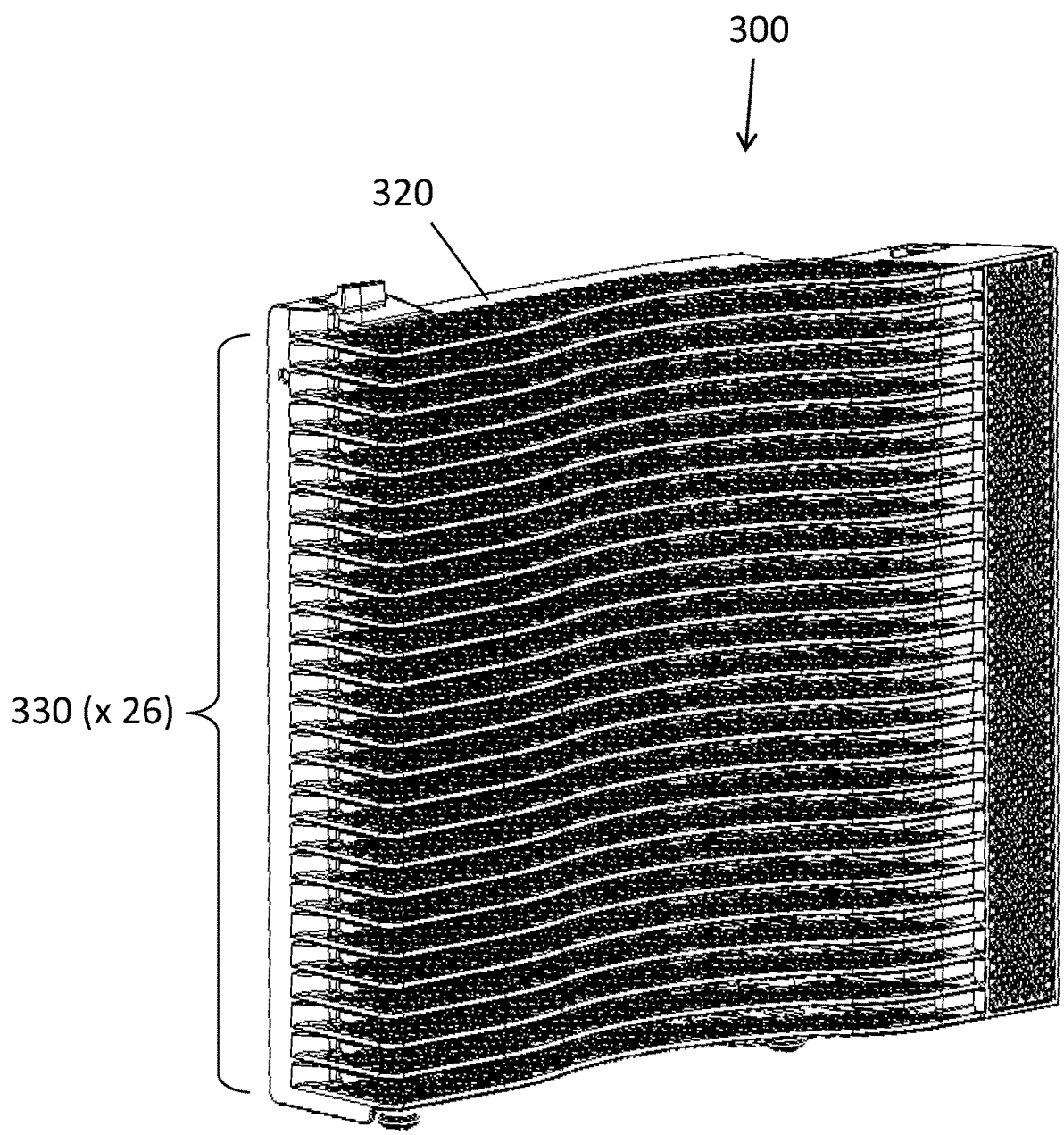
FIG. 3D shows a perspective view of the wafer support member of FIG. 3A, from a second angle, according to various aspects of the present disclosure.
Figure 3E:
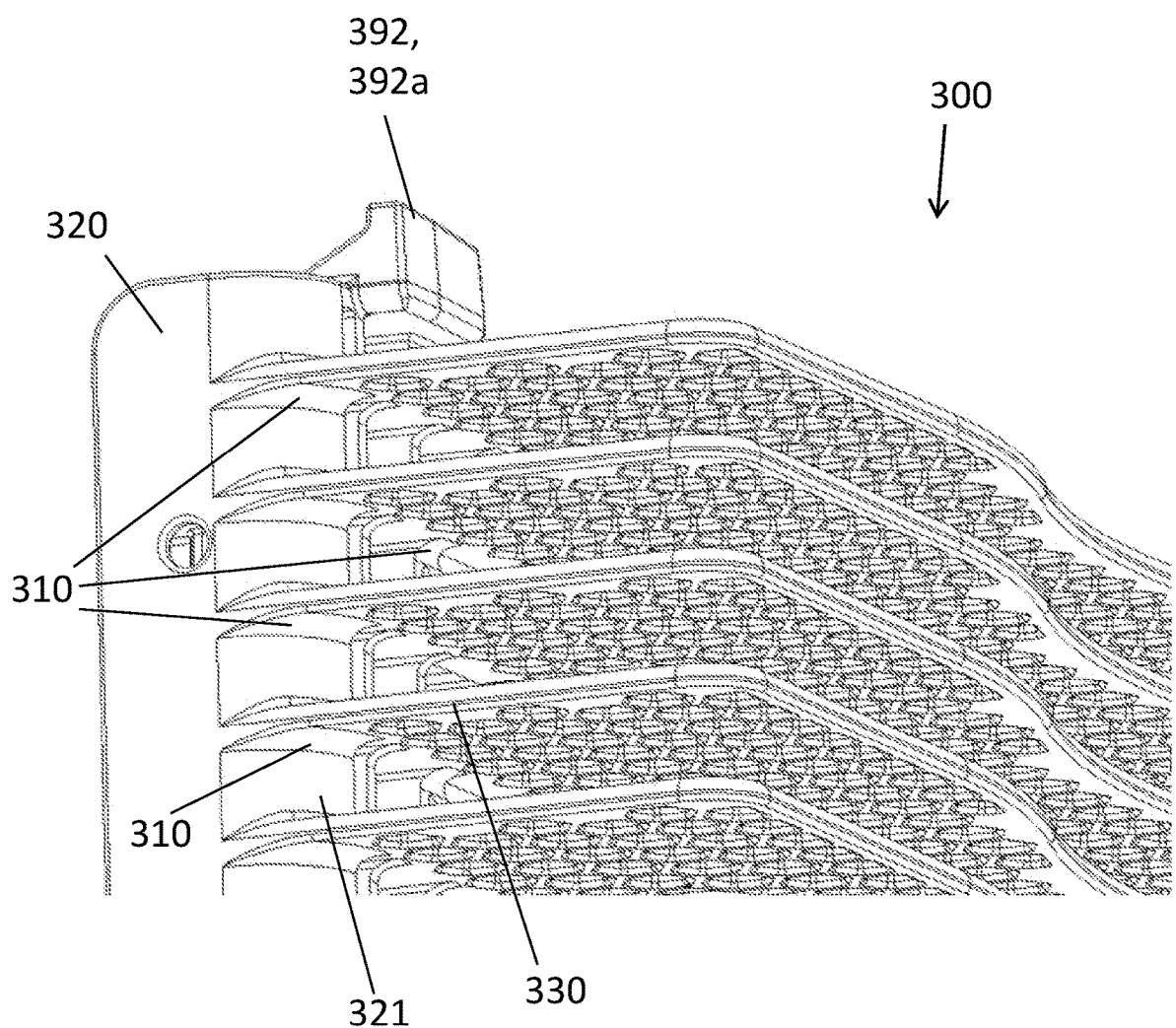
FIG. 3E is a close-up perspective view of a fillet element of the wafer support member of FIG. 3A, according to various aspects of the present disclosure.
Figure 3F:
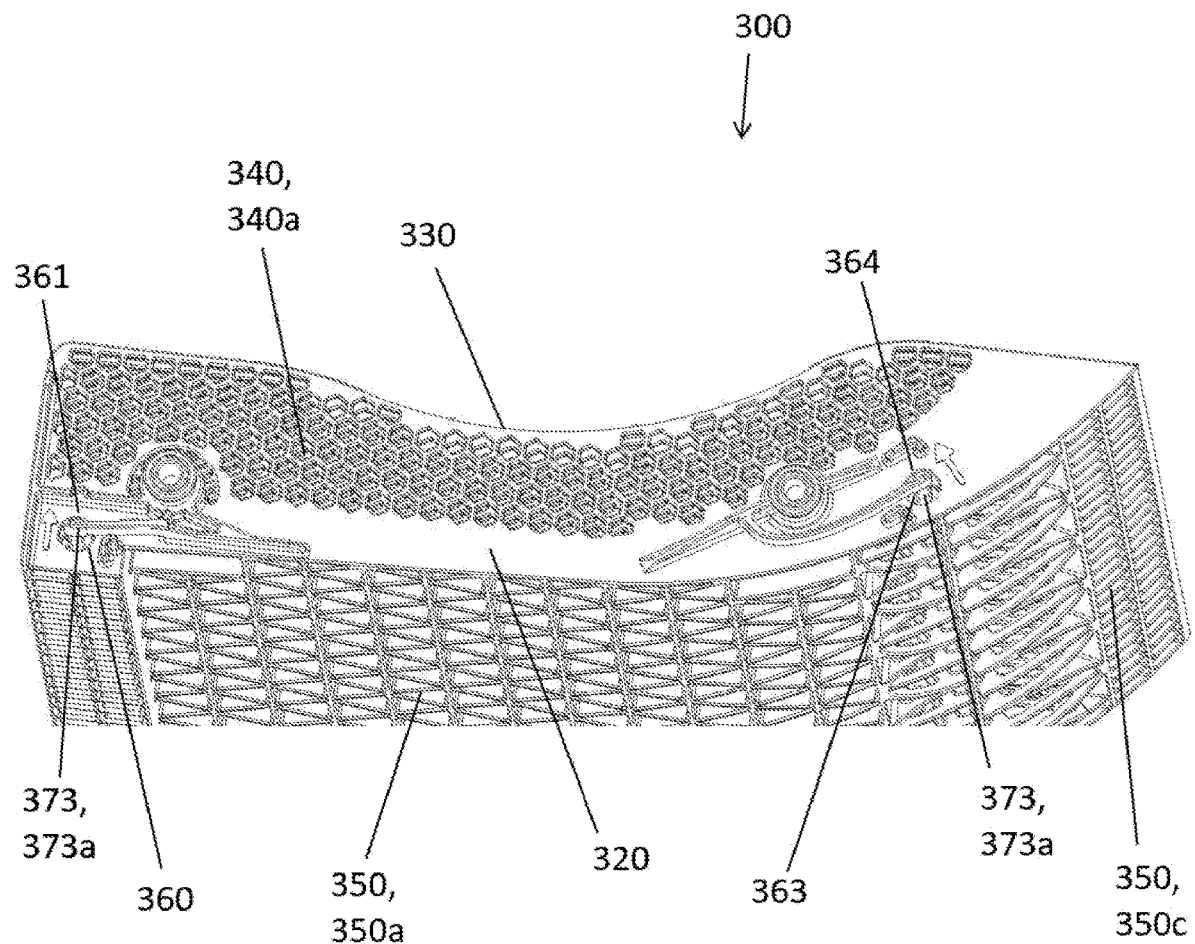
FIG. 3F shows a close-up underside perspective view of the wafer support member of FIG. 3A, according to various aspects of the present disclosure.
Figure 3G:
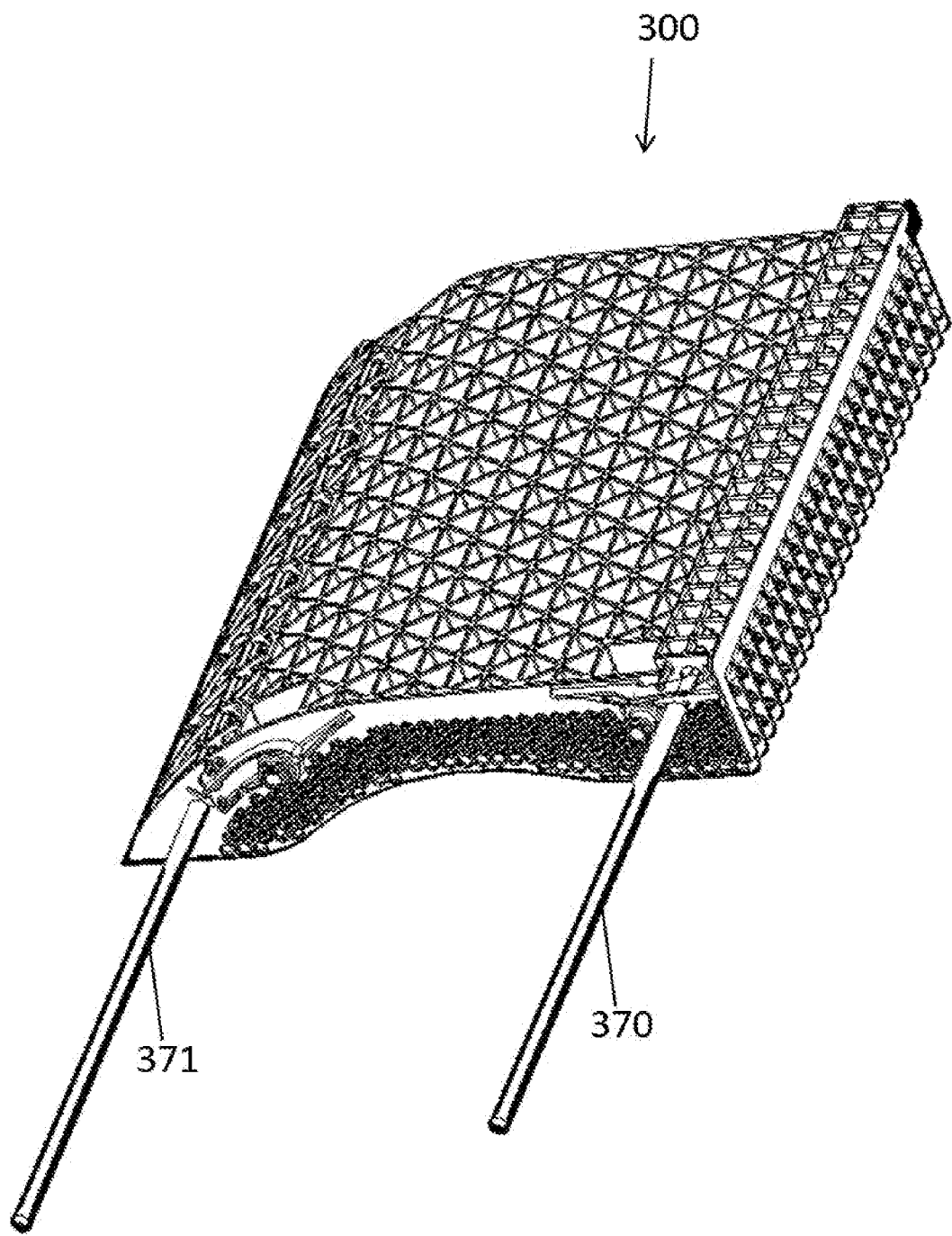
FIG. 3G shows a perspective view of the wafer support member of FIG. 3A and a pair of reinforcing rods, according to various aspects of the present disclosure.
Figure 3H:
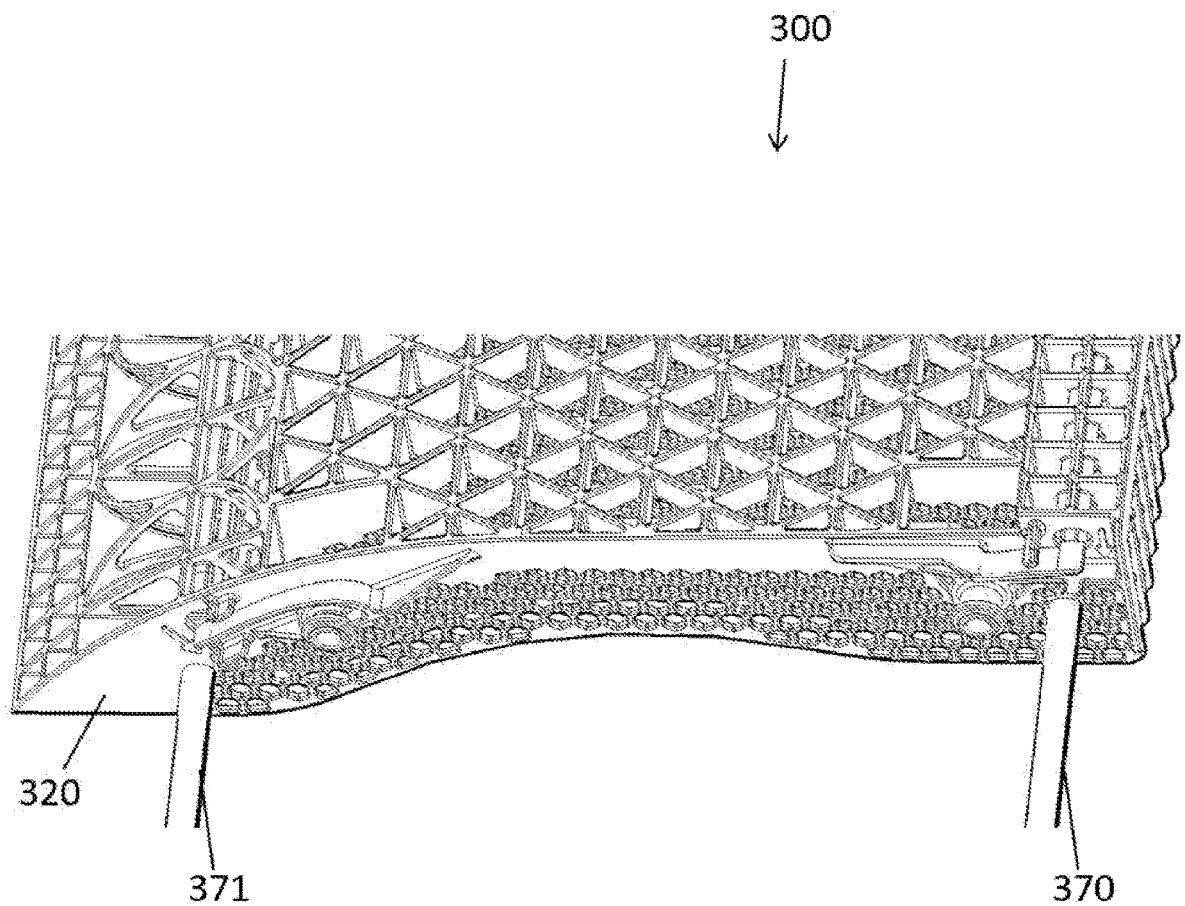
FIG. 3H shows a close-up view of the wafer support member of FIG. 3A and pair of reinforcing rods, of FIG. 3G, according to various aspects of the present disclosure.
Figure 3I:
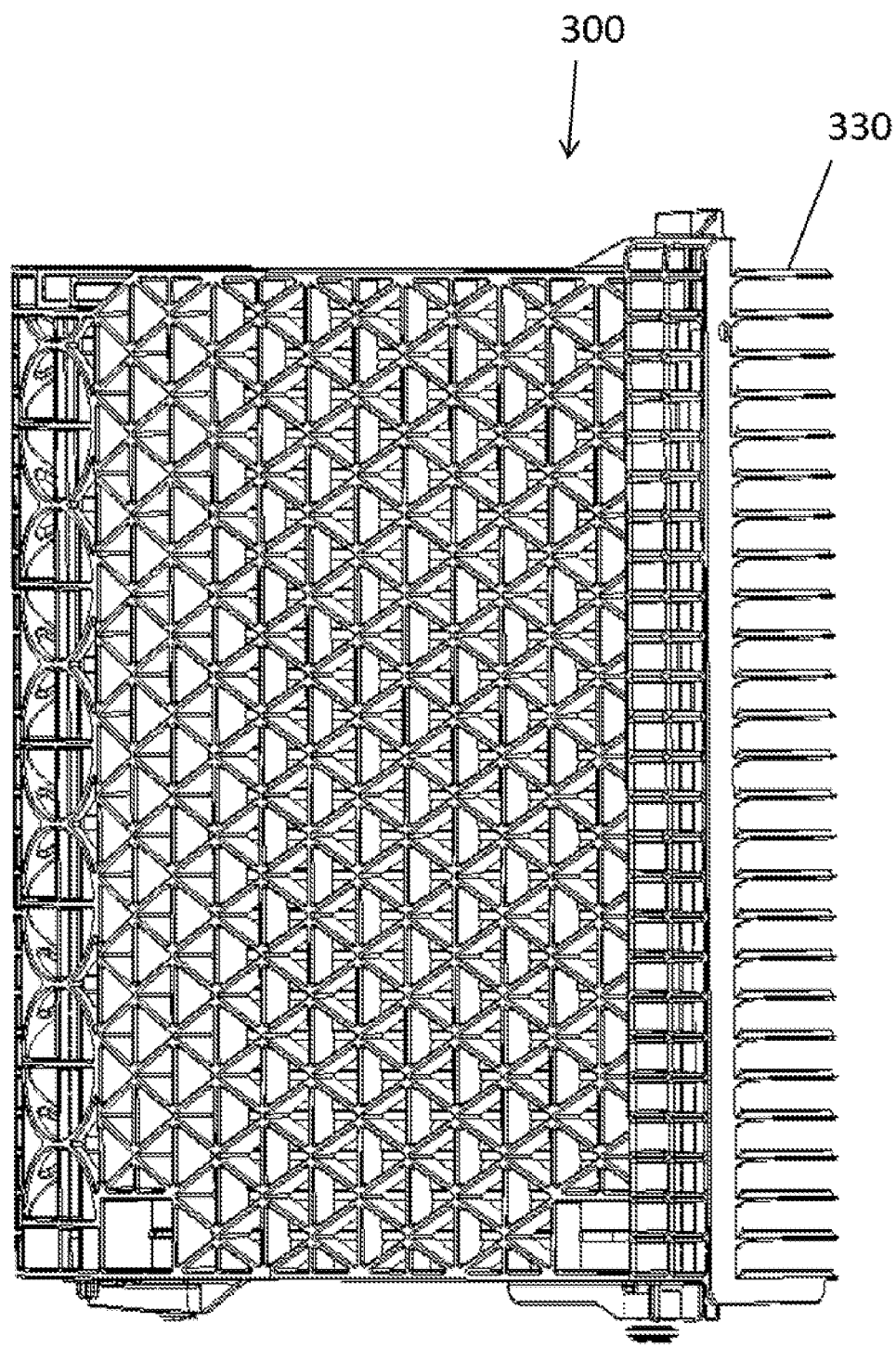
FIG. 3I shows a perspective view of the wafer support member of FIG. 3A, from a third angle, according to various aspects of the present disclosure.
Figure 3J:
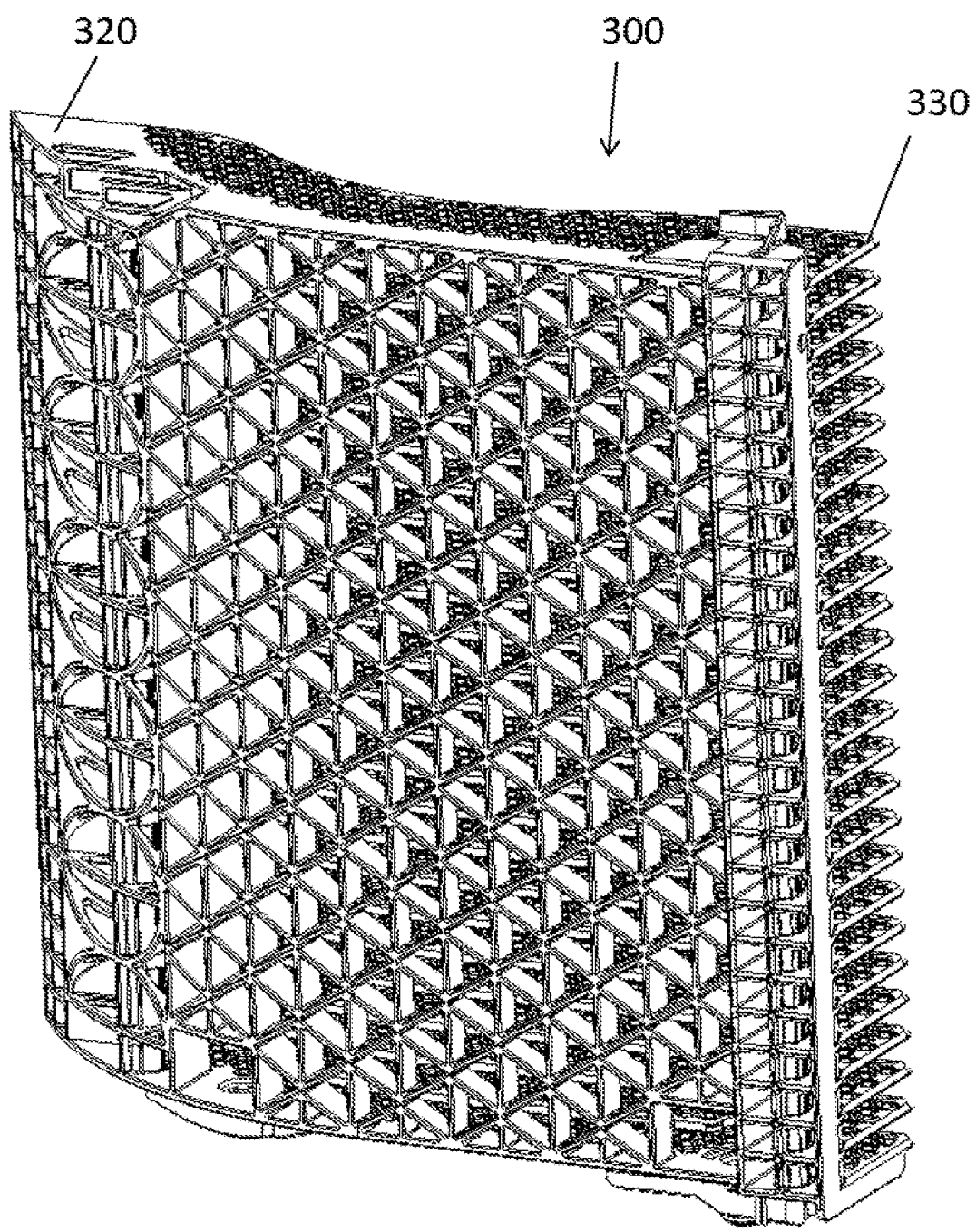
FIG. 3J shows a perspective view of the wafer support member of FIG. 3A, from a fourth angle, according to various aspects of the present disclosure.
Figure 3K:
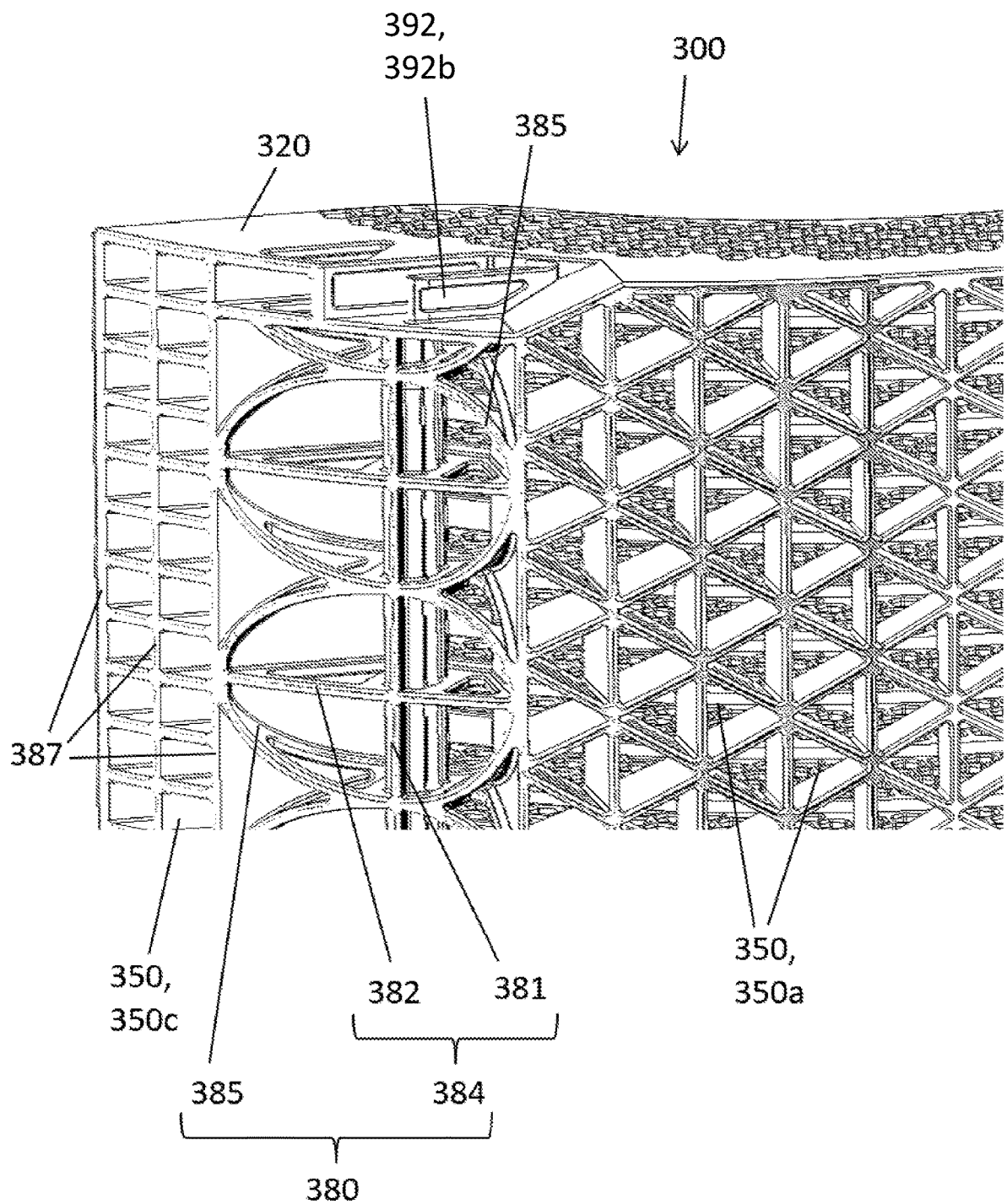
FIG. 3K shows a close-up partial view of a reinforcing arrangement of the wafer support member of FIG. 3A, from a first angle, according to various aspects of the present disclosure.
Figure 3L:
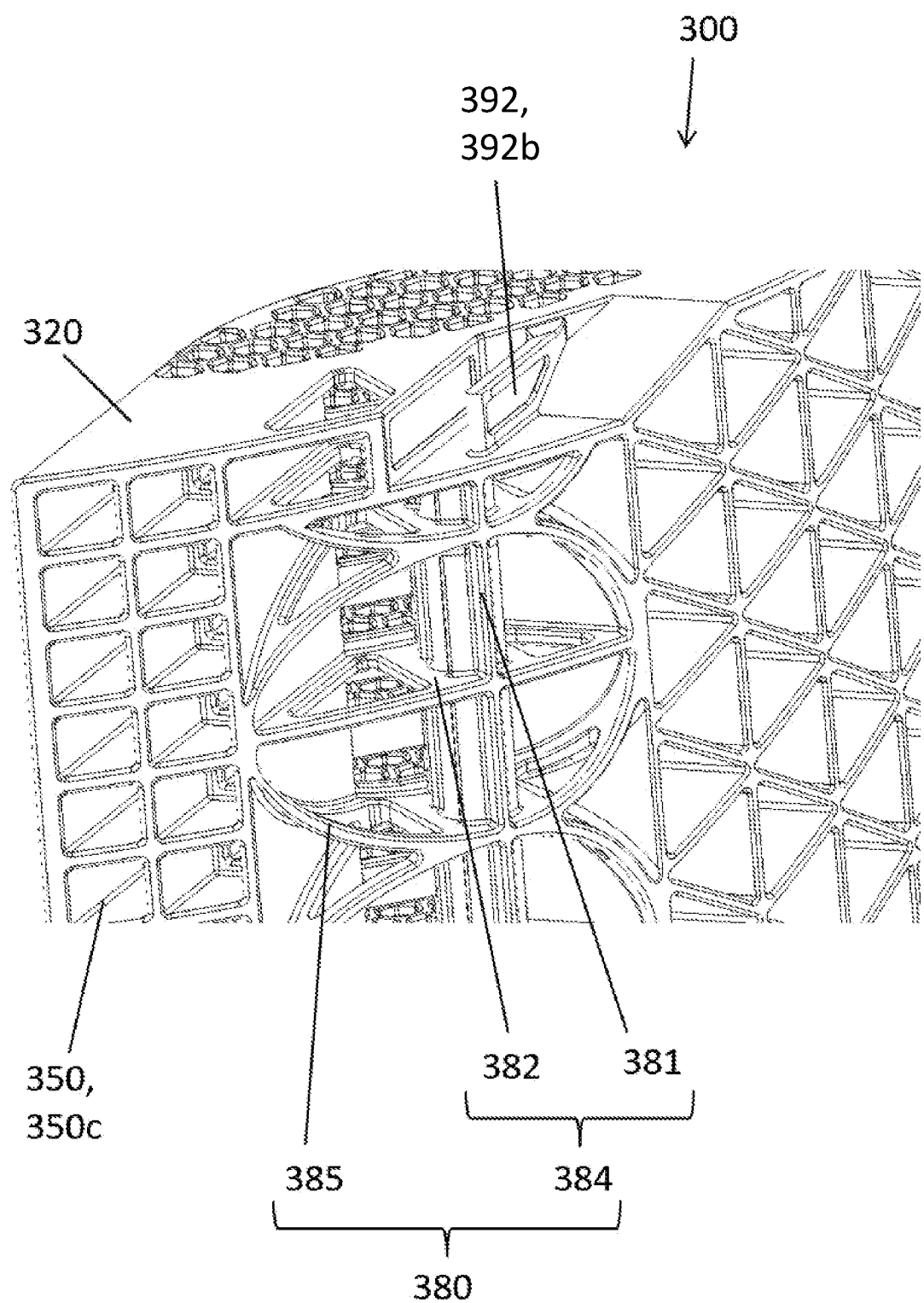
FIG. 3L shows a close-up partial view of the reinforcing arrangement of the wafer support member of FIG. 3A, from a second angle, according to various aspects of the present disclosure.
Figure 3M:
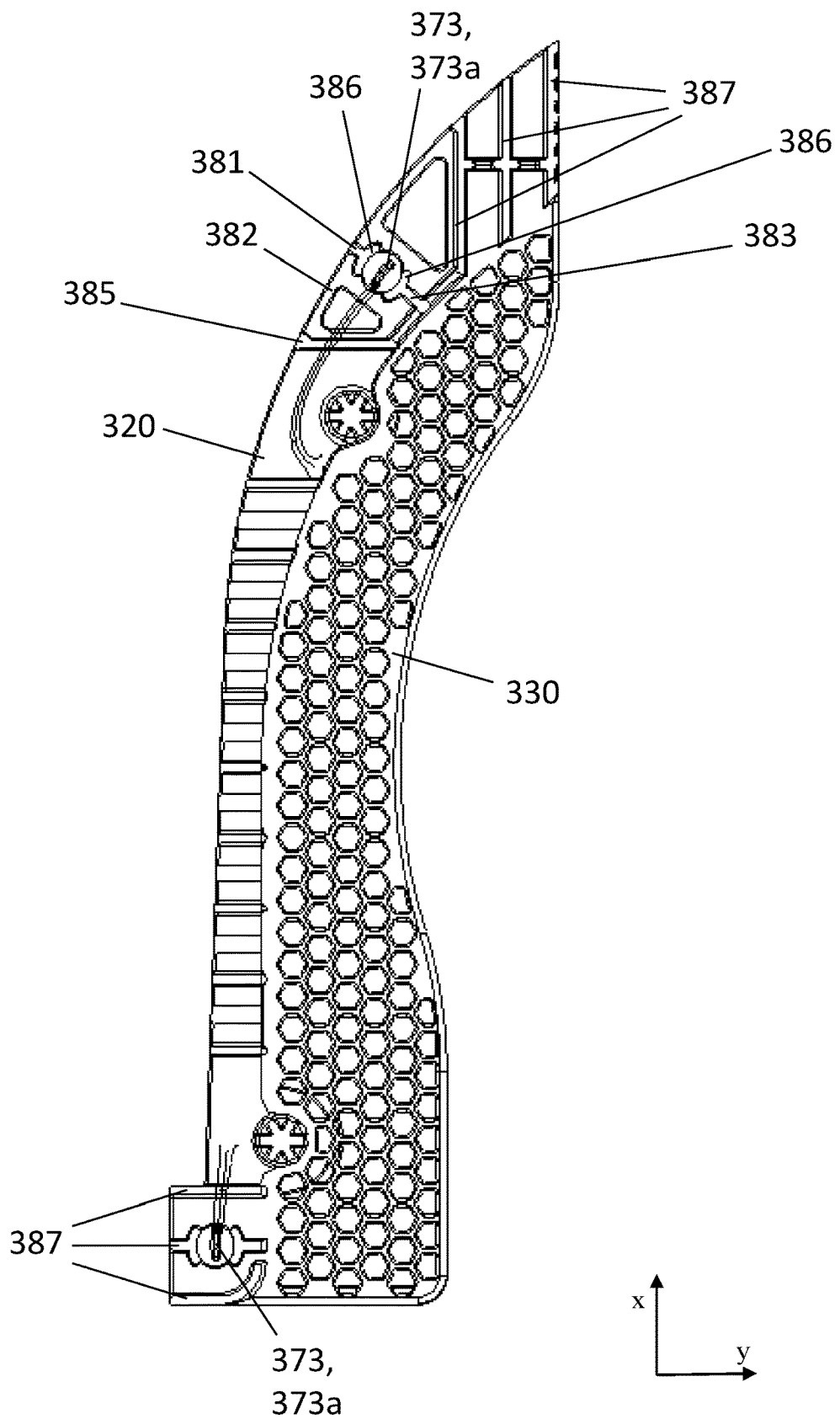
FIG. 3M shows a top cross-sectional view of the wafer support member, showing the reinforcing arrangement of FIG. 3K, according to various aspects of the present disclosure.
Figure 3N:
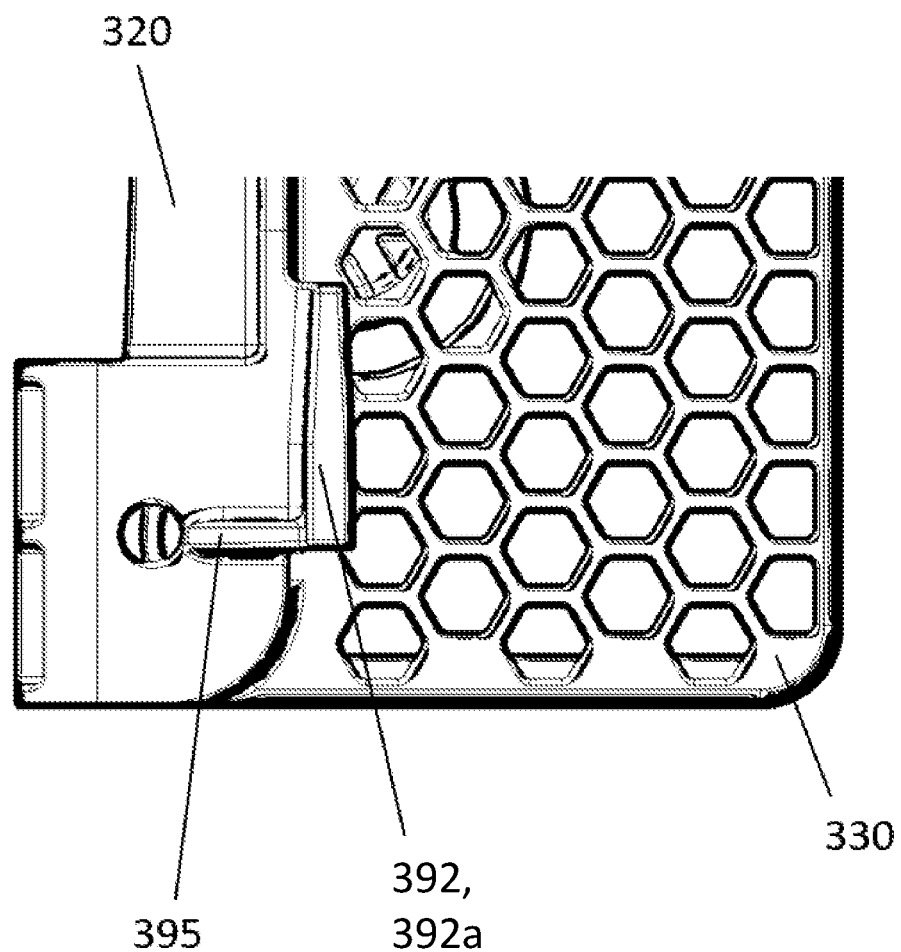
FIG. 3N shows a close-up top view of a securing element of the wafer support member of FIG. 3A at a front of the wafer support member, according to various aspects of the present disclosure.
Figure 3O:
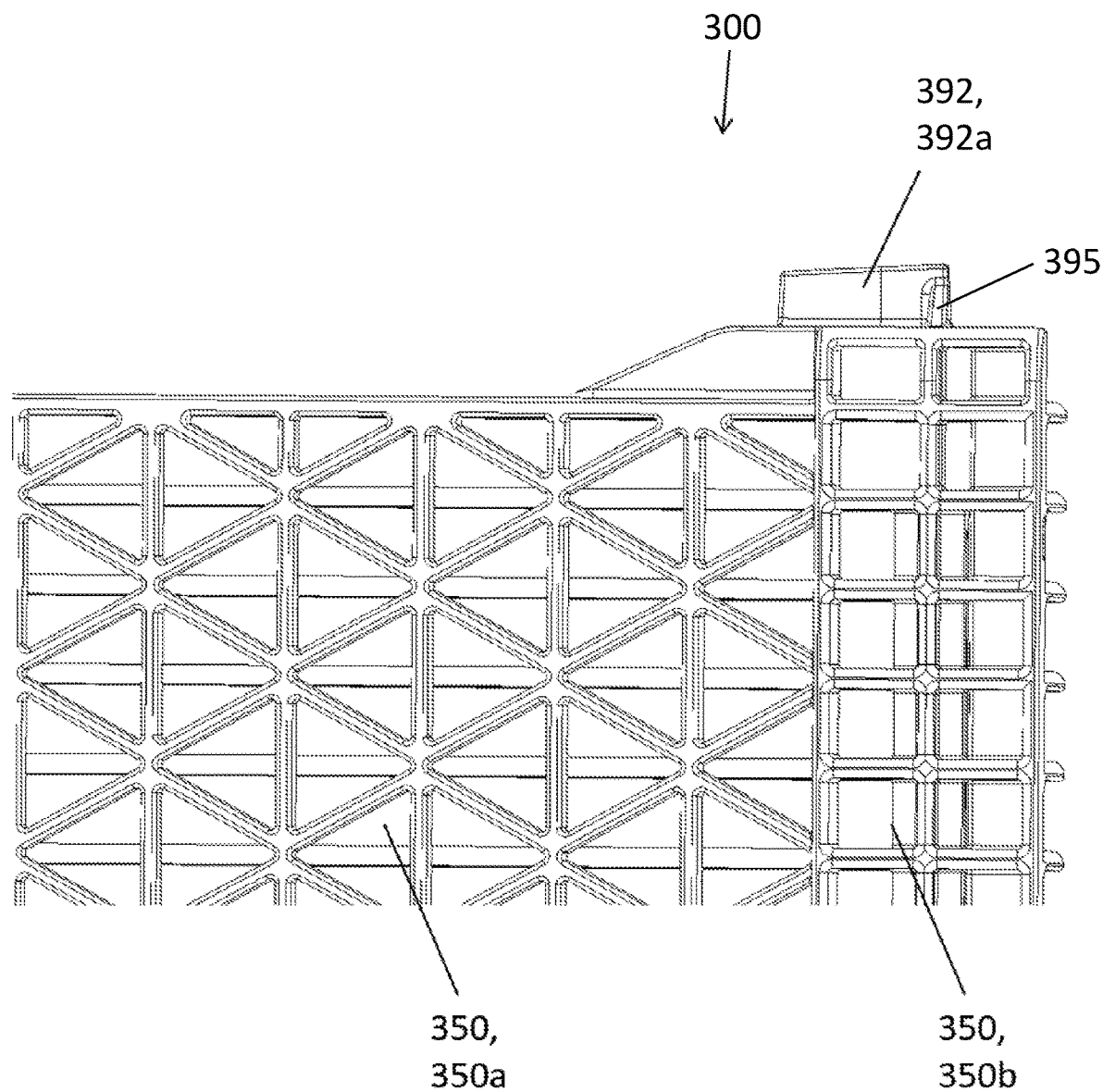
FIG. 3O shows a close-up side view of the securing element of FIG. 3N, according to various aspects of the present disclosure.
Figure 3P:
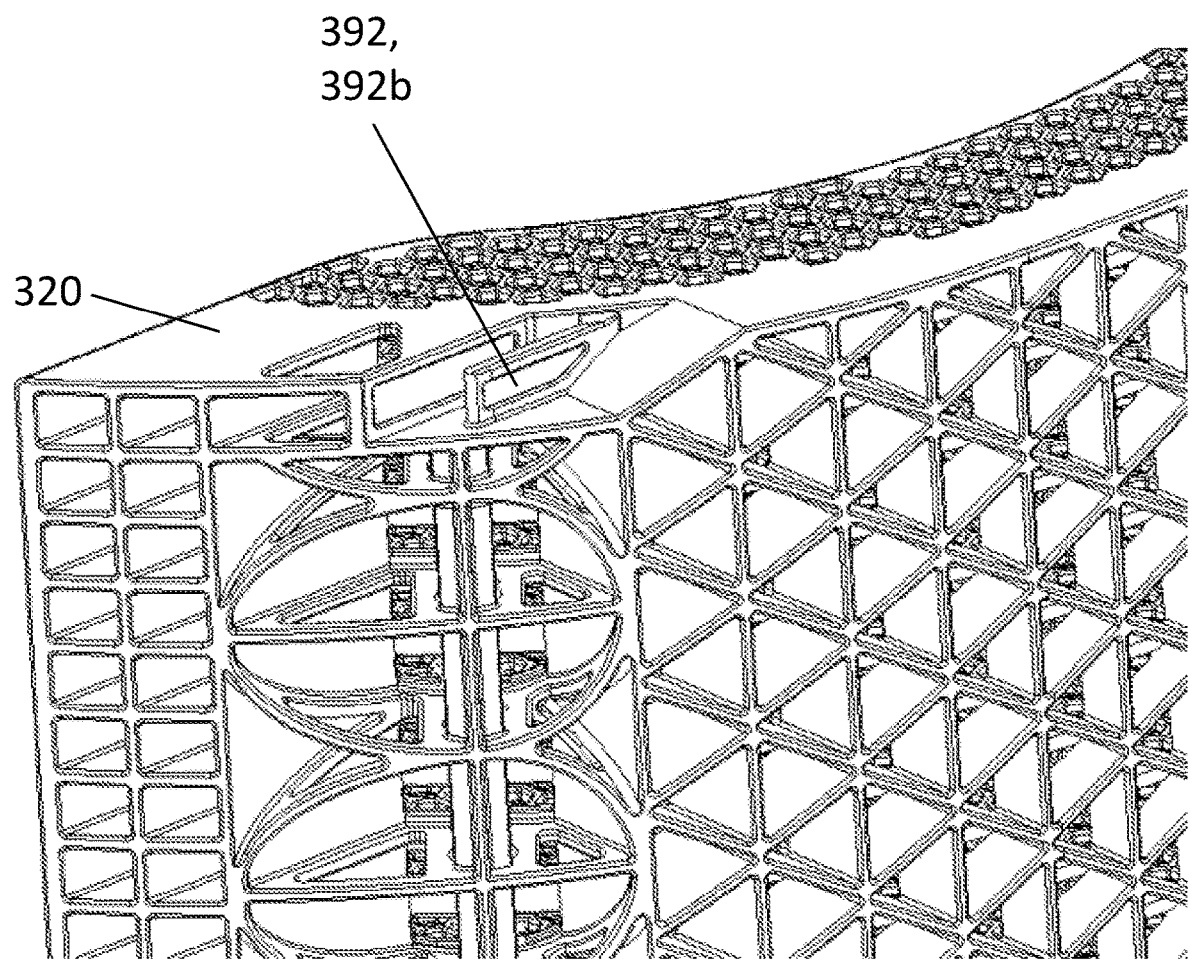
FIG. 3P shows a close-up perspective view of a securing element of the wafer support member at a rear of the wafer support member, according to various aspects of the present disclosure.
Figure 3Q:
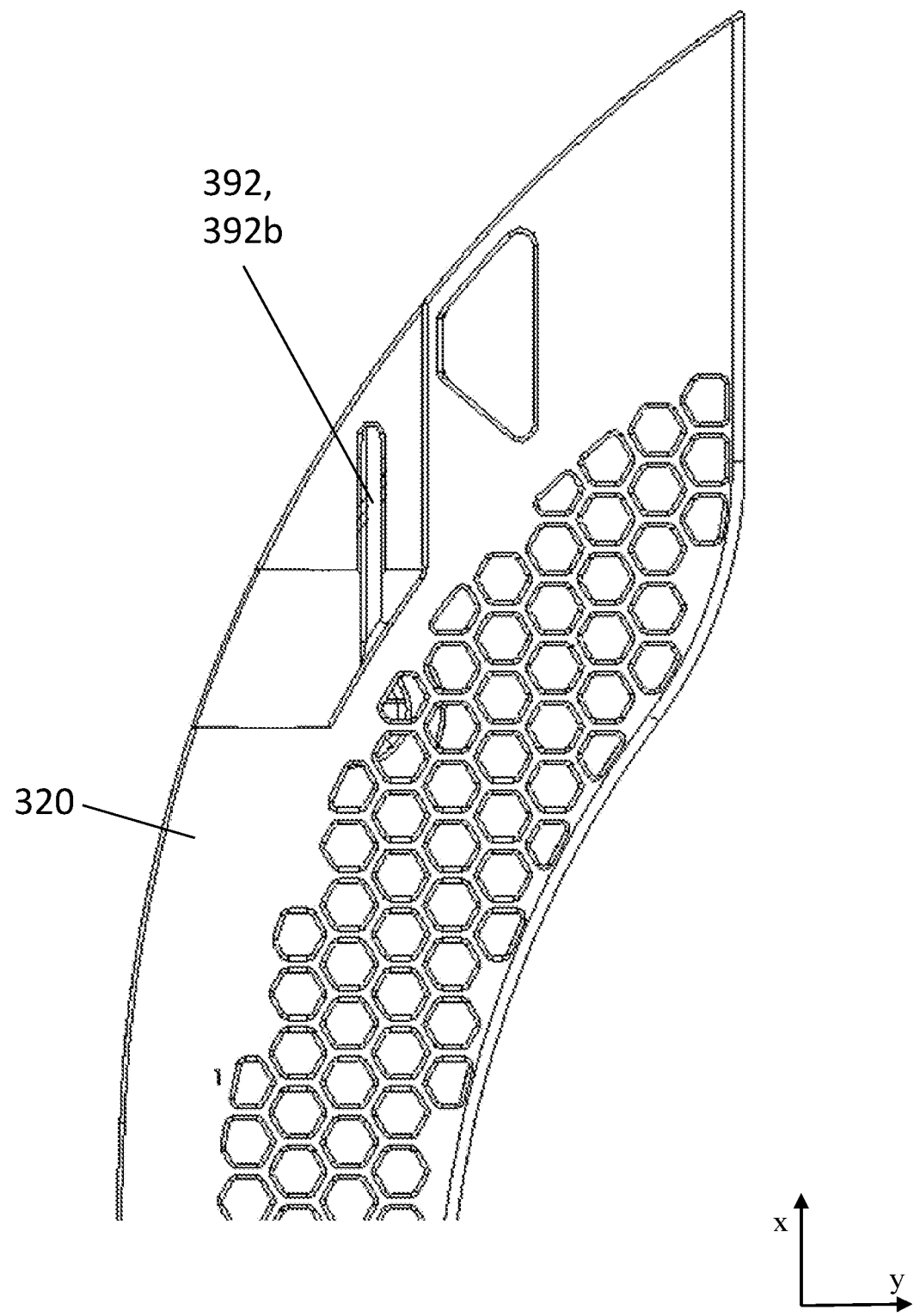
Figure 3R:
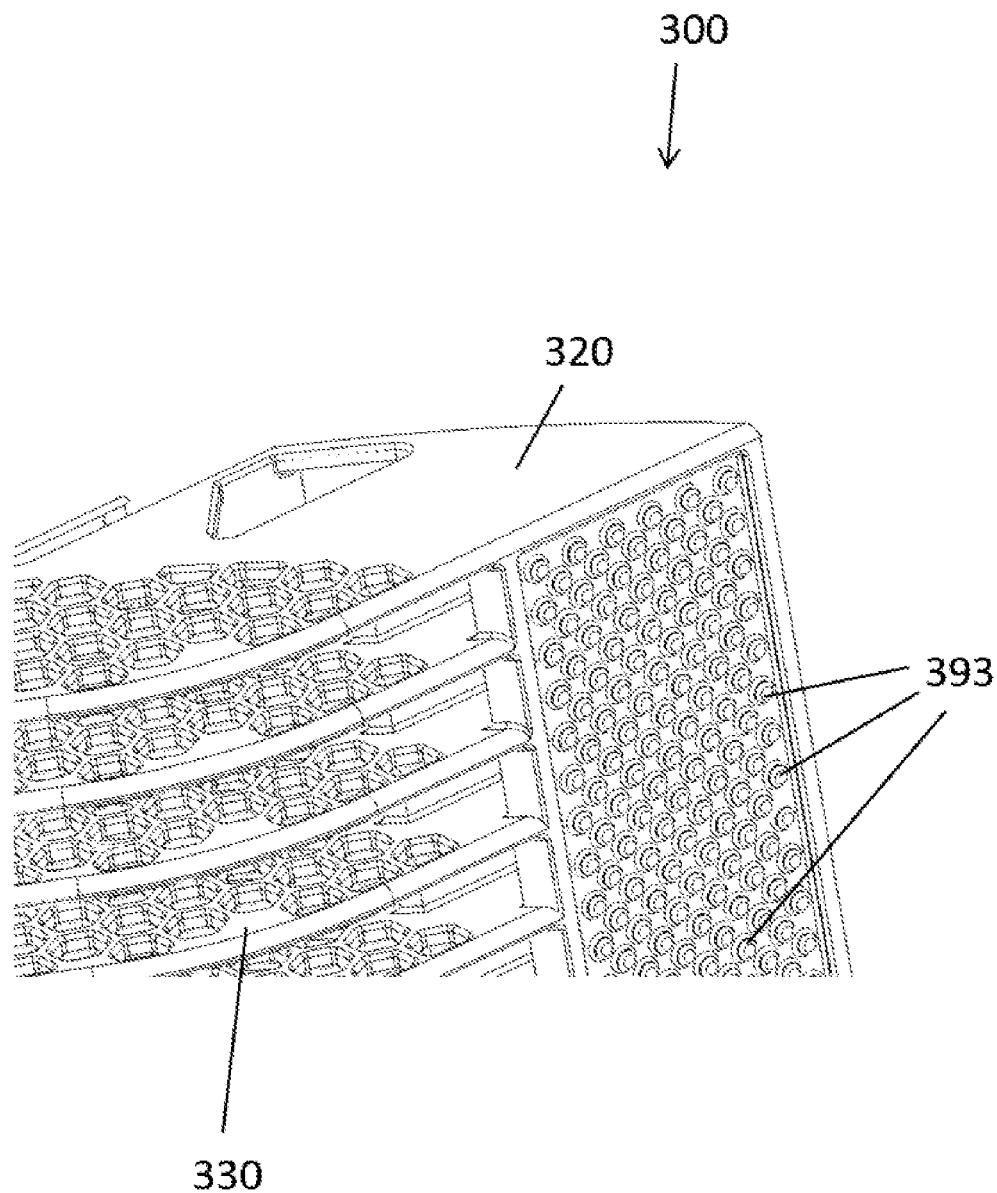
Figure 3S:
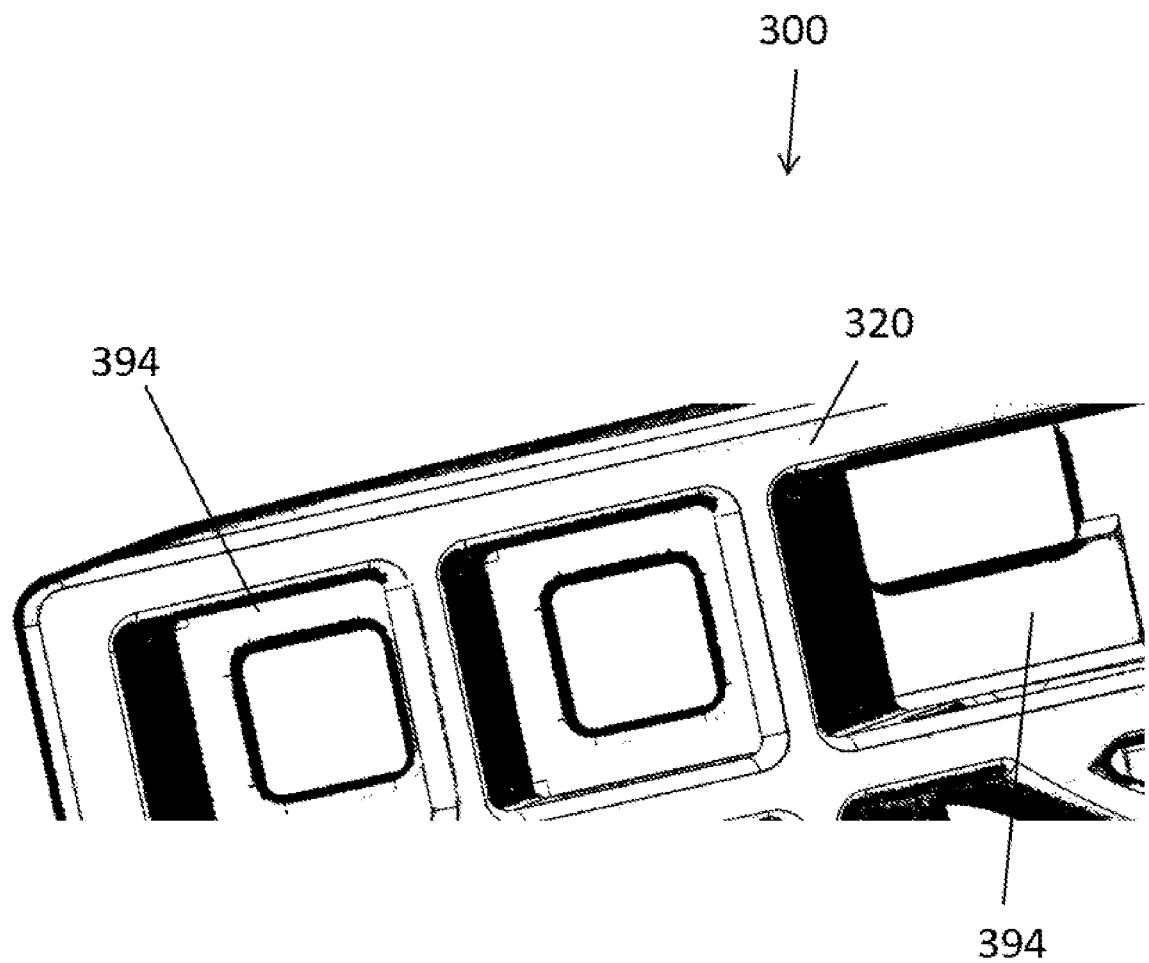
Figure 4A:
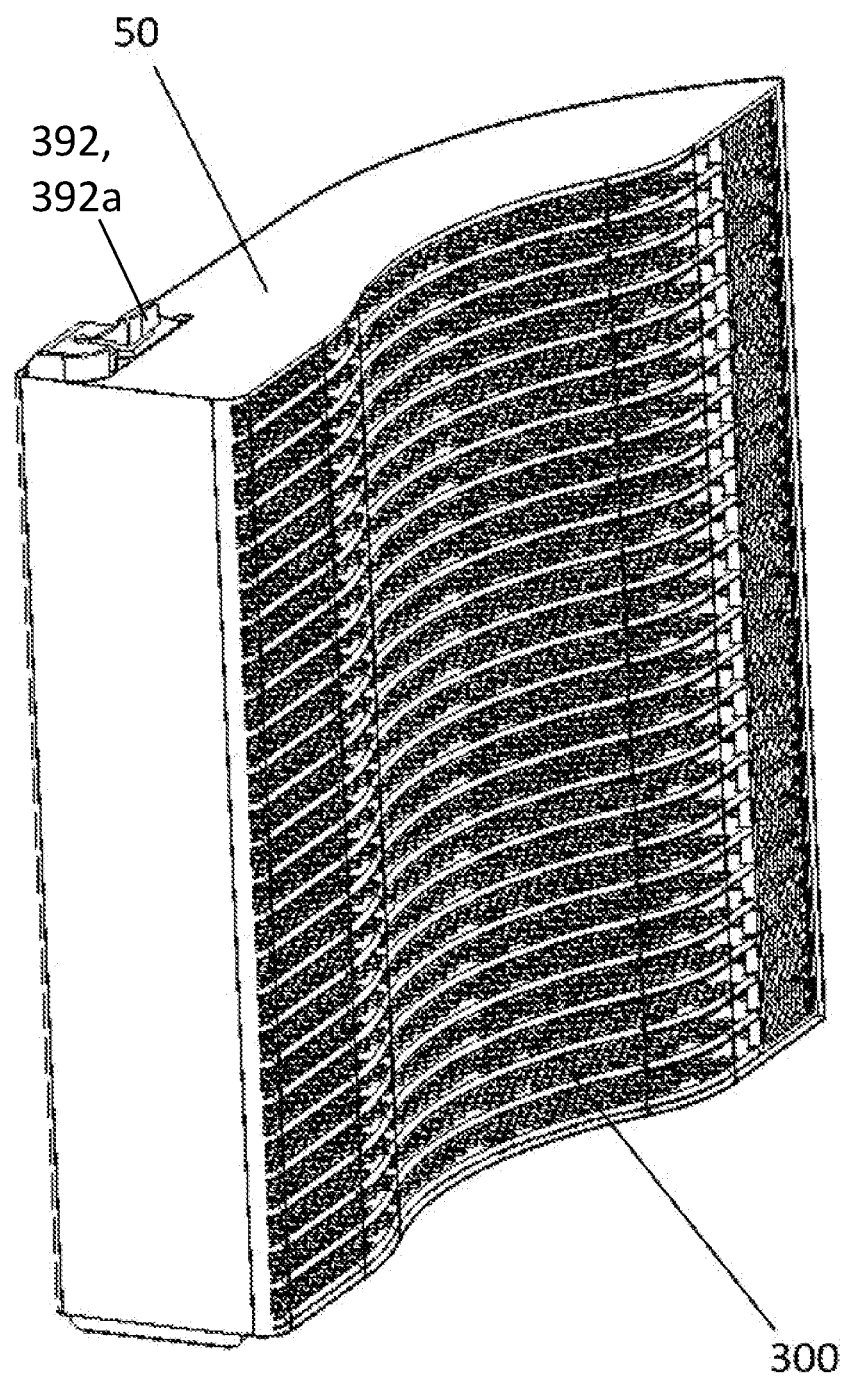
Figure 4B:
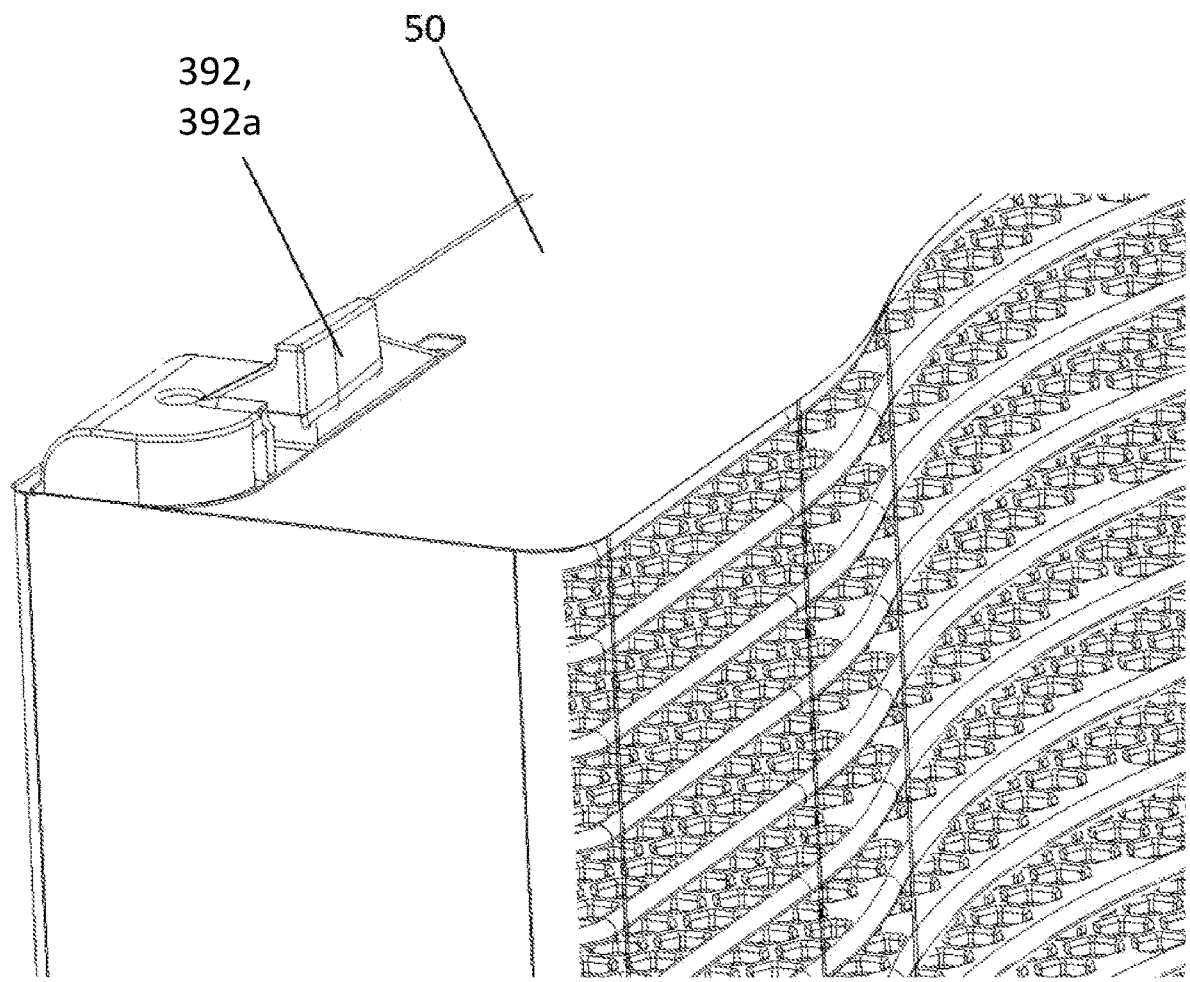

3Q shows a close-up perspective view of the securing element of FIG. 3P, according to various aspects of the present disclosure;

FIG. 3R shows a close-up partial view of a surface-enhancement element of the wafer support member of FIG. 3A, according to various aspects of the present disclosure;

FIG. 3S shows a close-up partial view of a variant surface-enhancement element of the wafer support member of FIG. 3A, according to various aspects of the present disclosure;

FIG. 4A shows a perspective view of an outer shell for the wafer support structure of FIG. 3A, according to various aspects of the present disclosure; and FIG. 4B shows a close-up partial view of the outer shell of FIG. 4A, according to various aspects of the present disclosure.

DETAILED DESCRIPTION

It will be understood that the aspects described below may be combined, for example, a part of one aspect may be combined with a part of another aspect.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

Figure 1A:
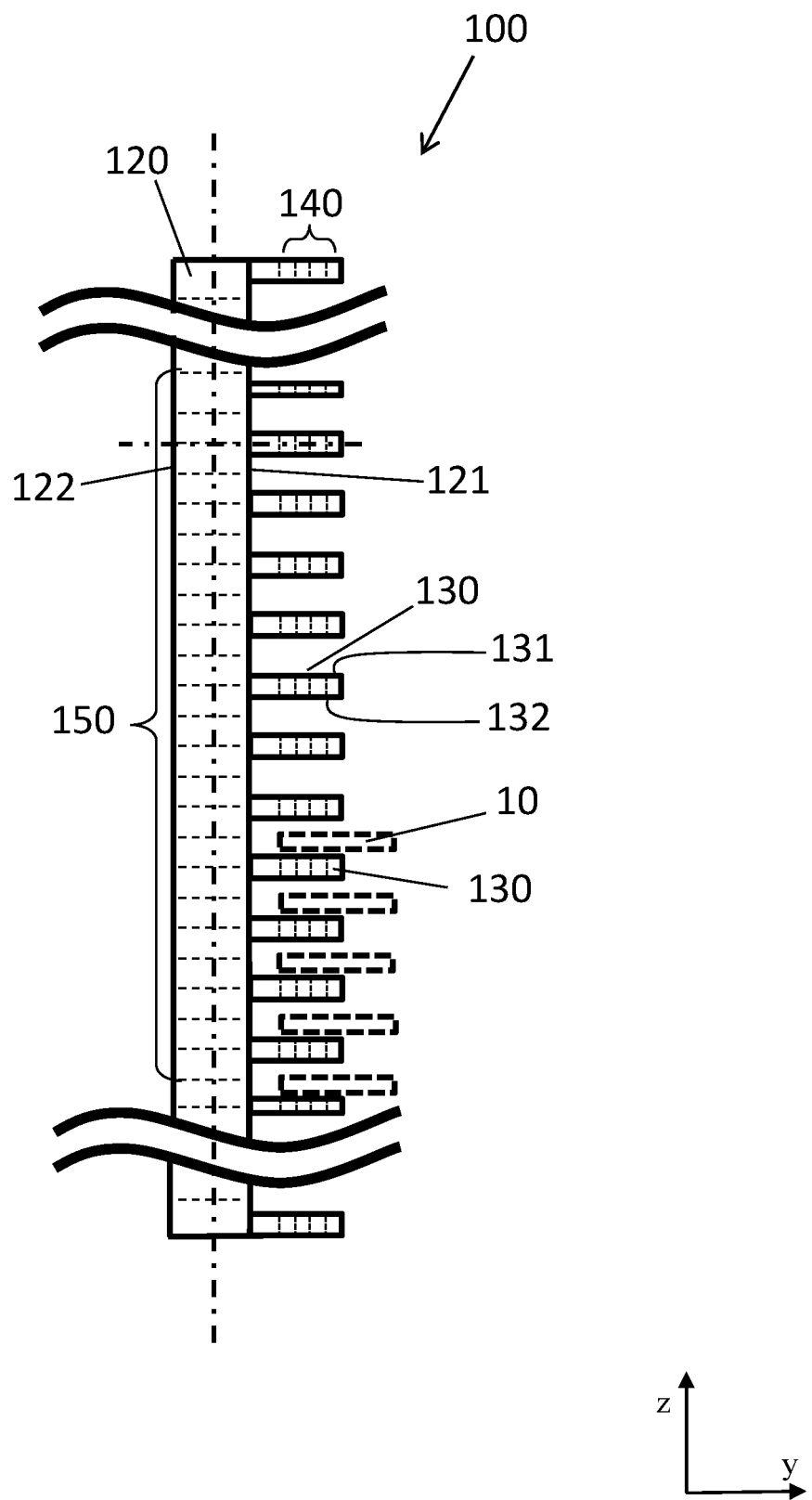
FIG. 1A shows a schematic front view of a wafer support member, according to an aspect of the present disclosure.

FIG. 1A shows a schematic front view of a wafer support member 100, according to an aspect of the present disclosure.

For ease of illustration, various aspects of the present disclosure may be described with reference to either a single wafer support member 100 or more than one (e.g. a pair of) wafer support members 100. Nevertheless, various aspects of the present disclosure described as such are not limited thereto. Thus, for example, various aspects of the present disclosure described with reference to only a single wafer support member 100 may also be applicable to more than one (e.g. two, three or more) wafer support members 100. Likewise, various aspects of the present disclosure described with reference to more than one (e.g. a pair of or two) wafer support members 100 may also be applicable to only a single wafer support member 100.

Figure 1B:
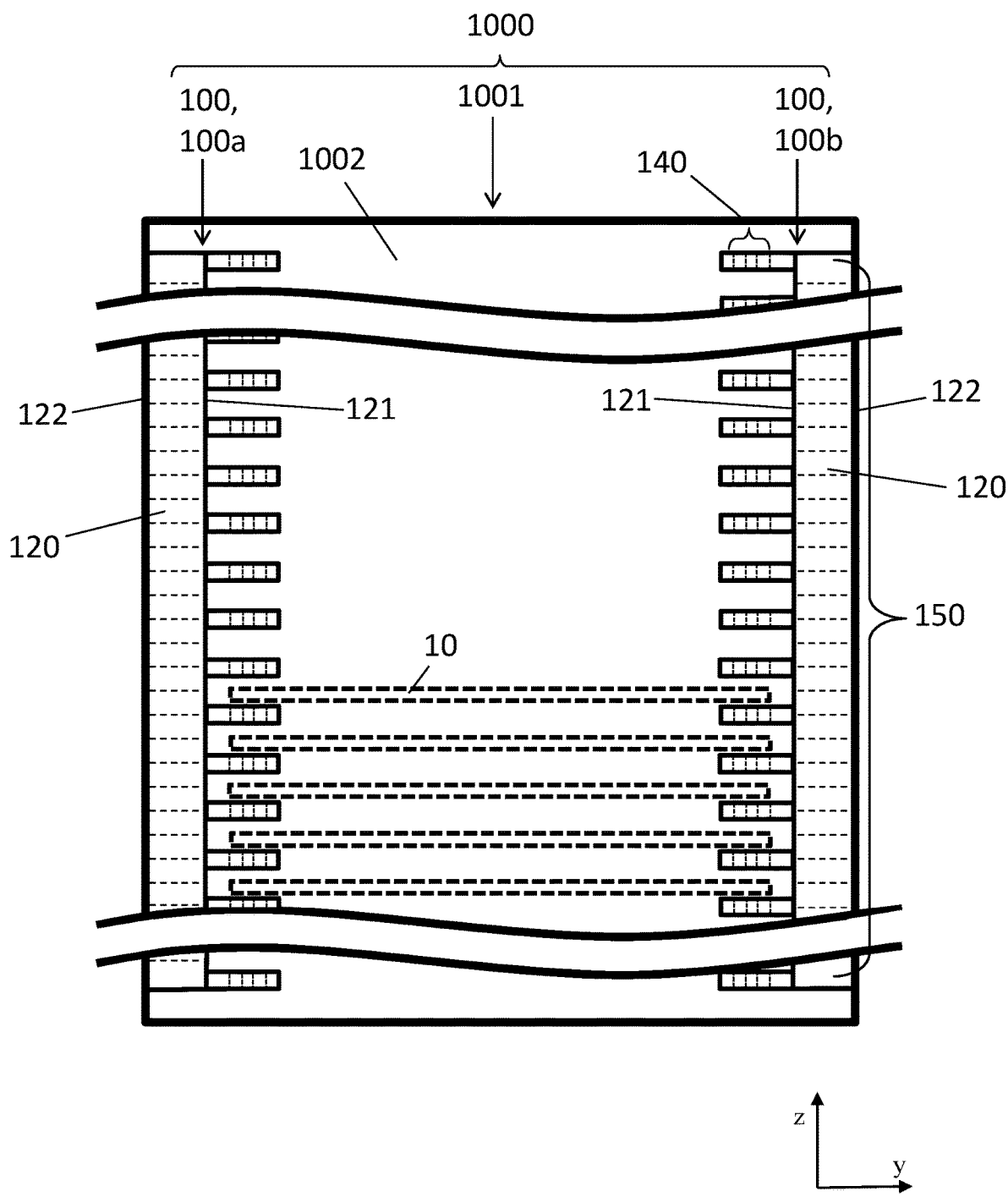
FIG. 1B shows a schematic front view of a wafer support assembly which includes a pair of the wafer support member of FIG. 1A, according to various aspects of the present disclosure.

As shown in FIG. 1A, the wafer support member 100 may include a support column 120. In particular, the support column 120 may be a vertical structure or frame, which may be adapted to stand upright within a wafer container 1001 (as shown in FIG. 1B). According to various aspects of the present disclosure, the support column 120 may include a first side 121 (e.g. an inner or inward-facing flank or surface). The first side 121 may be a side of the support column 120 configured to face a plurality of wafer disks 10 supported by the wafer support member 100. The support column 120 may include a second side 122 (e.g. an outer or outward-facing flank or surface) opposite the first side 121.

The wafer support member 100 may include (e.g. further include) a plurality of (e.g. two or more) wafer-engagement-shelves 130 (e.g. teeth, panels or flat panels, etc.) extending substantially perpendicularly to the support column 120 from the first side 121 of the support column 120. The plurality of wafer-engagement-shelves 130 may be configured to or for engaging and/or supporting a plurality of wafer disks 10. In particular, each wafer-engagement-shelf 130 may include a wafer-engagement surface 131 (e.g. upward-facing surface) for engaging and/or supporting a respective wafer disk 10 thereon, and may further include a base surface 132 (e.g. downward-facing surface) opposite the wafer-engagement surface 131. Accordingly, each wafer-engagement surface 131 may be a flat or substantially flat surface (i.e. without any protruding structures) for interfacing with a planar wafer disk 10. Each pair of neighbouring (e.g. immediately adjacent or closest) wafer-engagement-shelves 130 of the plurality of wafer-engagement-shelves 130 may define a slot for receiving a respective wafer disk 10 therein. As an example, according to various aspects of the present disclosure, the plurality of wafer-engagement-shelves 130 may be spaced apart from each other at regular intervals (in other words, at a substantially equal distance between each pair of neighbouring wafer-engagement-shelves 130 of the plurality of wafer-engagement-shelves 130). As an example, the wafer support member 100 may include 26 wafer-engagement-shelves 130 (i.e. forming or defining 25 slots for 25 wafer disks 10). As another example, the wafer support member 100 may include 25 wafer-engagement-shelves 130 for supporting 25 wafer disks 10. In other words, when the wafer support member 100 includes 25 wafer-engagement-shelves 130, the wafer support member 100 may define 25 slots for 25 wafer disks 10 (e.g. with the topmost wafer-engagement-shelf 130 and an upper surface of the wafer container 1001 defining a respective slot), thereby enabling the 25 wafer-engagement-shelves 130 to support 25 wafer disks. According to various aspects of the present disclosure, the plurality of wafer-engagement-shelves 130 may be identical or similar (e.g. in form, shape, size, dimension(s), etc.) to each other. For example, each wafer-engagement-shelf 130 may have a width (e.g. uniform width or average width, measured laterally from the first side 121 of the support column 120 to an opposite/exposed lateral side of the wafer-engagement-shelf 130) of approximately 40 mm, and/or a length (e.g. measured longitudinally from the front to the rear of the wafer-engagement-shelf 130) of approximately 240 mm (e.g. 237 mm).

According to various aspects of the present disclosure, each wafer-engagement-shelf 130 may define a plurality of through-holes 140 (e.g. openings) extending between the base surface 132 and the opposite wafer-engagement surface 131 of the wafer-engagement shelf 130. The plurality of through-holes 140 may be distributed across at least 30%, at least 40%, at least 50%, or more than 50% (e.g. at least 75%, or at least 80%, or at least 90%) of the surface area (e.g. entire lateral surface area) of each wafer-engagement-shelf 130. In particular, the plurality of through-holes 140 may be arranged or optimized (e.g. by being arranged in an orderly and/or regular pattern) to fill substantially the entire wafer-engagement-shelf 130. The plurality of through-holes 140 of each wafer-engagement-shelf 130 may be configured as, or may be configured to serve as, discharge ports (e.g. outlets or communication ports or passageways) for a plurality of loose particulates (e.g. loose additive manufacturing powder) on the wafer-engagement-shelf 130 to exit therefrom, via the discharge ports. For example, an average diameter of each of the plurality of through-holes 140 may be between approximately 5 mm to approximately 10 mm (e.g. 9.1 mm), i.e. larger than an average diameter of each loose particulate. According to various aspects of the present disclosure, the discharge ports may also serve to enable or allow a fluid (e.g. liquid, washing solution, etc.) on the wafer-engagement-shelves 130 to drain away therefrom, via the discharge ports (e.g. after the wafer support member 100 is washed with the fluid).

Accordingly, during an additive manufacturing process or 3-Dimensional printing process which may make use of additive manufacturing powder (i.e. loose particulates) to manufacture or print the wafer support member 100, according to various aspects of the present disclosure, any loose additive manufacturing powder which do not form a completed (i.e. printed) wafer support member 100 may escape or reach away from the slots between neighbouring pairs of wafer-engagement-shelves 130, via the discharge ports. In other words, the discharge ports may provide a place for the powder material to go or reach through so that, during cooling of a hot or heated (e.g. freshly printed) wafer support member 100, the powder material may not get trapped or packed between neighbouring pairs of wafer-engagement-shelves 130 of the printed wafer support member 100. Therefore, the discharge ports of each wafer-engagement-shelf 130 may prevent or minimize any "fanning" or "bending" or "folding" effect on the wafer support member 100 (e.g. in particular, on the support column 120 of the wafer support member 100) when the wafer support member 100 shrinks or contracts during cooling, thereby enabling the wafer support member 100 to be manufacturable via an additive printing process or 3-Dimensional printing process.

According to various aspects of the present disclosure, the plurality of through-holes 140 (e.g. all of the plurality of through-holes 140) of each wafer-engagement-shelf 130 may be identically (e.g. substantially identically) shaped and sized.

Further, the plurality of through-holes 140 may be arranged (e.g. packed) in an orderly and/or regular pattern such that each wafer-engagement-shelf 130 may be (e.g. sufficiently) stiff and/or rigid (e.g. to support a respective wafer disk 10 thereon) while defining the plurality of openings (i.e. through-holes 140). For example, according to various aspects of the present disclosure, the plurality of through-holes 140 of each wafer-engagement-shelf 130 may be or may include an array of hexagonal-shaped through-holes (e.g. having a diagonal dimension across any opposing two flats of approximately 5 mm) arranged in a honeycomb pattern. As another example, the plurality of through-holes 140 of each wafer-engagement-shelf 130 may be or may include an array of triangular-shaped through-holes arranged in an isometric pattern or iso grid pattern or bi grid pattern, etc. According to various aspects of the present disclosure, the plurality of through-holes 140 of each wafer-engagement-shelf 130 may be or may include any suitable array of through-holes arranged in any suitable pattern (e.g. orderly and/or regular pattern) or combination of patterns to or for enabling the wafer-engagement-shelf 130 to be (e.g. sufficiently) stiff and/or rigid (e.g. to support a wafer disk 10 thereon) and/or to help reduce thermal mass during 3-Dimensional Printing.

According to various aspects of the present disclosure, the plurality of through-holes 140 of each wafer-engagement-shelf 130 may be spaced uniformly apart or at a uniform distance from one another. In other words, neighbouring or immediately adjacent or each neighbouring pair of through-holes of the plurality of through-holes 140 may be spaced at a same distance from one another. For example, each pair of through-holes of the plurality of through-holes 140 may be spaced (e.g. uniformly spaced) between approximately 1.6 mm to 2.5 mm (e.g. 1.8 mm) from each other. Thus, for example, each wafer-engagement-shelf 130 may include through-hole walls (i.e. defining the plurality of through-holes 140, e.g. hexagonal-shaped through-holes or triangular-shaped through-holes) with a wall thickness (e.g. uniform wall thickness) of approximately 1.6 mm to 2.5 mm (e.g. 1.8 mm).

According to various aspects of the present disclosure, a height of each wafer-engagement-shelf 130 (i.e. measured between the base surface 132 and the wafer-engagement surface 131) may be between approximately 1.6 mm to 2.5 mm (e.g. 2.2 mm). In particular, the height of each wafer-engagement-shelf 130 may be larger or thicker than the thickness of each through-hole wall of the wafer-engagement shelf 130. For example, a ratio of the height of each wafer-engagement-shelf 130 to the thickness of each through-hole wall may be 2:1, or 11:9, or 10:9, or 7:6, or 23:18. As such, each wafer-engagement-shelf 130 may be (e.g. sufficiently) stiff and/or rigid (e.g. for supporting a weight of a wafer disk 10 thereon), and the thinner through-hole walls (e.g. 1.8 mm or approximately 1.8 mm in thickness) of the wafer-engagement-shelf 130 may improve or facilitate manufacturability (e.g. printing) of the wafer-engagement-shelf 130 (e.g. via an additive manufacturing process or 3-Dimensional printing process).

According to various aspects of the present disclosure, the wafer support member 100 may include at least one fillet element (e.g. a fillet, a fillet portion, a rounding of an inside or interior corner, an arc-shaped corner, etc.) (see, for example, reference numeral 310 in FIG. 3E) between the base surface 132 of one or more or each (or every) wafer-engagement-shelf 130 and the first side 121 of the support column 120 (i.e. that faces the corresponding wafer-engagement-shelf 130). Specifically, according to various aspects of the present disclosure, the wafer support member 100 may include one or more fillet elements at one or more or every intersection or junction where the base surface 132 of the wafer-engagement-shelf 130 and the first side 121 of the support column 120 meet. In other words, the one or more fillet elements of the wafer support member 100 may be bridging the base surface 132 of the wafer-engagement-shelf 130 and the first side 121 of the support column 120 at one or more or every intersection or junction where the base surface 132 of the wafer-engagement-shelf 130 and the first side 121 of the support column 120 meet. In yet other words, one or more or every junction or corner (e.g. inner and/or underside corner) of the wafer support member 100, where the base surface 132 of the wafer-engagement-shelf 130 and the first side 121 of the support column 120 meet, may include or may be a rounded or an arc-shaped (e.g. concaved-shaped) corner (i.e. the fillet element). According to various aspects of the present disclosure, the fillet element may be integrally molded or printed with the support column 120 and each respective wafer-engagement-shelf 130 (e.g. via an additive manufacturing process or 3-Dimensional printing process).

According to various aspects of the present disclosure, each corner or junction between the wafer-engagement surface 131 (i.e. upward-facing surface) of each wafer-engagement-shelf 130 and the first side 121 of the support column 120 may be free of or without any fillet element. That is, each upper side corner or junction between the wafer-engagement surface 131 (i.e. upward-facing surface) of each wafer-engagement-shelf 130 and the first side 121 of the support column 120 may be a straight (e.g. substantially straight) edge or pointed (e.g. substantially pointed) inner corner (e.g. having a small radius of curvature, e.g. approximately 0.5 mm or less).

According to various aspects of the present disclosure, each fillet element may be configured to distribute a stress force on the wafer support member 100 (e.g. across at least the entire span of the fillet element, between the support column 120 and the wafer-engagement-shelf 130). Accordingly, the fillet element may prevent or minimize an extent of the one or more or every wafer-engagement-shelf 130 (i.e. supported by a respective underside fillet element) from flexing or bending or folding downwards or towards or into the first side 121 of the support column 120 (e.g. during cooling of a freshly printed/hot/soft wafer support member 100). Accordingly, the fillet element of the wafer support member 100 may contribute to or may enable the wafer support member 100 to be manufacturable (e.g. via an additive manufacturing process or 3-Dimensional printing process) with the plurality of wafer-engagement-shelves 130 of the wafer support member 100 maintained perpendicular (e.g. substantially perpendicular) to the support column 120 (e.g. even during cooling/shrinking of the wafer support member 100). In other words, according to various aspects of the present disclosure, the fillet element(s) may contribute to or help maintain one or more or all the plurality of wafer-engagement-shelves 130 to be perpendicular (e.g. substantially perpendicular) to the support column 120 during manufacture of the wafer support member 100. As an example, a fillet radius of curvature of each fillet element may be within, but is not limited to, a range of between approximately 1 mm to approximately 6 mm (e.g. 3 mm).

As shown in FIG. 1A, the support column 120 of the wafer support member 100 may include (e.g. further include) or define a plurality of drain holes 150 extending between the first side 121 and the second side 122 of the support column 120. Specifically, the plurality of drain holes 150 may be or may include a plurality of through-holes extending, through the support column 120, between the first side 121 and the second side 122 of the support column 120. The plurality of drain holes 150 may be for or may be configured to enable or allow a fluid (e.g. liquid, or loose solid particulates/loose powder) on the wafer-engagement-shelves 130 to drain away therefrom, via the plurality of drain holes 150. According to various aspects of the present disclosure, the plurality of drain holes 150 may be arranged (e.g. packed) in an orderly and/or regular pattern for or such that the support column 120 may be (e.g. sufficiently) stiff and/or rigid while defining the plurality of openings (e.g. drain holes 150). As an example, the plurality of drain holes 150 may include or may be an array of triangular-shaped through-holes arranged in an isometric pattern or iso grid pattern or bi grid pattern, etc., across the support column 120 (e.g. entire support column 120). As another example, the plurality of drain holes 150 may include (e.g. additionally or optionally include) an array of square-shaped (i.e. square or squarish-shaped) through-holes arranged in a straight/stacked/ortho-grid pattern (e.g. in combination or alongside the array of triangular-shaped through-holes). According to various aspects of the present disclosure, the plurality of drain holes 150 may be or may include any suitable array of through-holes arranged in any suitable pattern or combination of patterns to or for enabling the support column 120 to be (e.g. sufficiently) stiff and/or rigid (e.g. to support the plurality of wafer-engagement-shelves 130).

According to various aspects of the present disclosure, the plurality of drain holes 150 of the support column 120 may be spaced uniformly apart or at a uniform distance from one another. In other words, neighbouring or immediately adjacent or each neighbouring pair of drain holes 150 of the plurality of drain holes 150 may be spaced at a same distance from one another. For example, each pair of drain holes 150 of the plurality of drain holes 150 may be spaced (e.g. uniformly spaced) between approximately 1.6 mm to 2.5 mm (e.g. 1.8 mm) from each other. Thus, for example, the support column 120 may include drain hole walls (i.e. defining the plurality of drain holes 150, e.g. hexagonal-shaped drain holes 150, triangular-shaped drain holes 150, squarish-shaped drain holes 150, etc.) with a wall thickness (e.g. uniform wall thickness) of approximately 1.6 mm to 2.5 mm (e.g. 1.8 mm).

According to various aspects of the present disclosure, a thickness of the support column 120 (i.e. measured between the first side 121 and the second side 122) may be between approximately 1.6 mm to 2.5 mm (e.g. 2.2 mm). In particular, the thickness of the support column 120 may be larger or thicker than the thickness of each drain hole wall of the support column 120. For example, a ratio of the thickness of the support column 120 to the thickness of each drain hole wall may be 2:1, or 11:9, or 10:9, or 7:6, or 23:18. As such, the support column 120 may be (e.g. sufficiently) stiff and/or rigid (e.g. for supporting the plurality of wafer-engagement-shelves 130), and the thinner drain hole walls (e.g. 1.8 mm or approximately 1.8 mm in thickness) of the support column 120 may improve or facilitate manufacturability (e.g. printing) of the support column 120 (e.g. via an additive manufacturing process or 3-Dimensional printing process).

According to various aspects of the present disclosure, the entire wafer support member 100 may be produced or manufactured via an additive manufacturing process (e.g. as a single monolithic piece). Accordingly, according to various aspects of the present disclosure, all the parts of the wafer support member 100 (or at least the support column 120 and the plurality of wafer-engagement-shelves 130) may be integrally molded or integrally printed with one another (e.g. as a single piece/entity). Therefore, the entire wafer support member 100 (or at least the support column 120 and the plurality of wafer-engagement-shelves 130) may be made of a same material (e.g. a polymer, compatible for use in an additive manufacturing process).

According to various aspects of the present disclosure, the wafer support member 100 may include a securing element (see, for example, reference numeral 392 in FIG. 3O) for inter-engaging or inter-locking with a corresponding securing element of a wafer container 1001 (e.g. a Front Opening Unified Pod (FOUP)) to guide and/or secure (e.g. detachably secure) the wafer support member 100 into and/or within the wafer container 1001 (e.g. an inner space 1002 of the wafer container 1001). For example, the securing element of the wafer support member 100 and the corresponding securing element of the wafer support column 120 may be or may include any one or a combination of a slot and tongue, a ball and socket, a guide and guide pin, a nut and bolt, a screw, or any other suitable securing element(s).

FIG. 1B shows a schematic front view of a wafer support assembly 1000, according to various aspects of the present disclosure.

With reference to FIG. 1B, the wafer support assembly 1000 may include a pair of or at least two (e.g. two or more) wafer support members 100. In other words, a pair or at least two wafer support members 100 may be configured or assembled to form the wafer support assembly 1000.

For ease of illustration, the wafer support assembly 1000 may be described herein with reference to a pair of (i.e. two) wafer support members 100. Nevertheless, various aspects of the present disclosure described as such are not limited thereto. Thus, for example, the wafer support assembly 1000 may include any other plural number (e.g. three, four, five, etc.) of wafer support members 100.

According to various aspects of the present disclosure, as shown in FIG. 1B, a first wafer support member 100a and a second wafer support member 100b of the wafer support assembly 1000, of the pair of at least two wafer support members 100, may be spaced apart from each other. That is, the first wafer support member 100a and the second wafer support member 100b of the wafer support assembly 1000 may be movable relative to each other, with a spacing or gap between the first wafer support member 100a and the second wafer support member 100b. In other words, the first wafer support member 100a and the second wafer support member 100b, of the at least two wafer support members 100 of the wafer support assembly 1000, may not, but is not limited to not, be in physical contact with one another.

Further, as shown, according to various aspects of the present disclosure, the at least two wafer support members 100 of the wafer support assembly 1000 may be oriented to face or oppose each other. In particular, the at least two wafer support members 100 may be oriented relative to each other in a manner such that the plurality of wafer-engagement-shelves 130 of the first wafer support members 100a may be opposing and aligned with (e.g. horizontally or laterally aligned with) the plurality of wafer-engagement-shelves 130 of the second wafer support member 100b, such that the aligned wafer-engagement-shelves 130 of the at least two wafer support members 100 of the wafer support assembly 1000 may be capable of evenly supporting a weight of a plurality of wafer disks 10 (e.g. during storage, transport, etc.).

According to various aspects of the present disclosure, the wafer support assembly 1000 may include (e.g. further include) the wafer container 1001 (e.g. a FOUP). In particular, the at least two wafer support members 100 may be disposed within the inner space 1002 of the wafer container 1001, for or so as to be capable of supporting or holding a plurality of wafer disks 10 within the inner space 1002 of the wafer container 1001.

Figure 2:
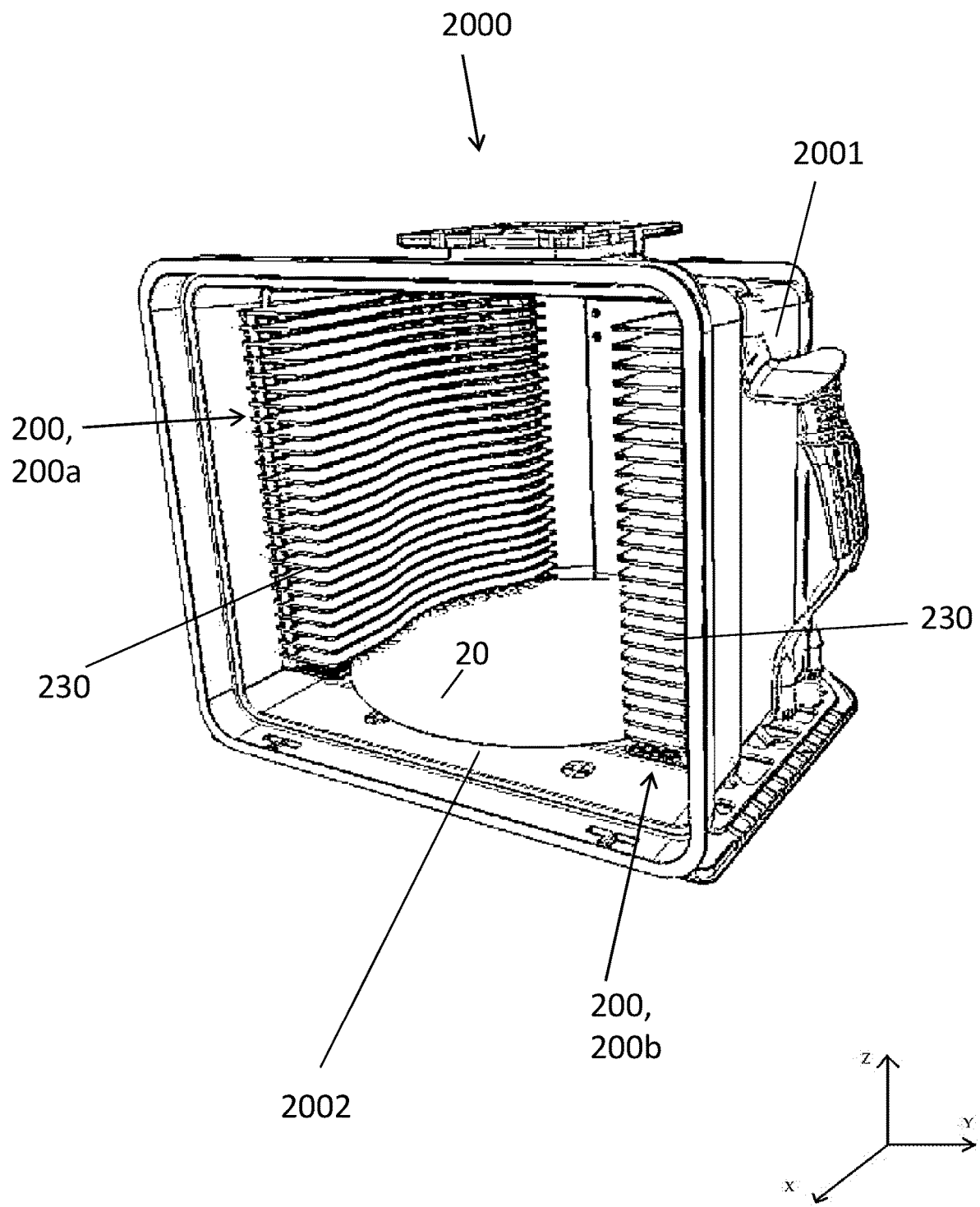
FIG. 2 shows a perspective view of a wafer support assembly, according to various aspects of the present disclosure.

FIG. 2 shows a perspective view of a pair of wafer support members 200 and a FOUP (e.g. wafer container 2001), of a wafer support assembly 2000, according to various aspects of the present disclosure.

According to various aspects of the present disclosure, each wafer support member 200 may contain any one or more or all the features and/or limitations of the wafer support member 100 of FIG. 1A and FIG. 1B. The description of the parts/features made with respect to wafer support member 100 is also applicable with respect to wafer support member 200, and vice versa.

As shown, each wafer support member 200 may include, but is not limited to including, a plurality (e.g. 26) wafer-engagement-shelves 230. Further, the wafer-engagement-shelves 230 of a first wafer support member 200a be opposing, and aligned with, the plurality of wafer-engagement-shelves 230 of a second wafer support member 200b, within an inner space 2002 of the FOUP 2001, for or so as to be capable of evenly supporting a weight of a wafer disk 20 on each pair of opposing and aligned (e.g. horizontally or laterally aligned) wafer-engagement-shelves 230 of the first wafer support member 200a and the second wafer support member 200b of the wafer support assembly 2000.

FIG. 3A shows a perspective view of a wafer support member 300, which includes a support column 320 defining drain holes and a plurality of wafer-engagement-shelves 330 defining through-holes 340, from a first angle, according to various aspects of the present disclosure.

FIG. 3B shows a top view of the wafer support member 300 of FIG. 3A, according to various aspects of the present disclosure.

FIG. 3C shows a side view of the wafer support member 300 of FIG. 3A, according to various aspects of the present disclosure.

According to various aspects of the present disclosure, the wafer support member 300 may contain any one or more or all the features and/or limitations of the wafer support member 100 of FIG. 1A and FIG. 1B and/or the wafer support member 200 of FIG. 2. In the following, the wafer support member 300 is described with like reference characters generally referring to the same or corresponding parts/features of the wafer support member 100 of FIG. 1A and FIG. 1B and/or the wafer support member 200 of FIG. 2. The description of the parts/features made with respect to wafer support member 300 is also applicable with respect to wafer support member 100 and/or the wafer support member 200, and vice versa As in the wafer support member 100 of FIG. 1A and FIG. 1B, the wafer support member 300 may include the support column 320 and the plurality of wafer-engagement-shelves 330.

With reference to FIG. 3B, each wafer-engagement-shelf 330 of the wafer support member 300 may define a plurality of through-holes 340 configured as discharge ports. In particular, the plurality of through-holes 340 of each wafer-engagement-shelf 330 of the wafer support member 300 may include or may be an array of hexagonal-shaped through-holes 340a arranged in a honeycomb pattern. According to various aspects of the present disclosure, a sub-set or all of the plurality of through-holes 340 of the plurality of wafer-engagement-shelves 330 of the wafer support member 300 may be aligned (e.g. vertically or axially aligned) with one another (e.g. to facilitate any loose particulates reaching through the plurality of aligned through-holes 340 from one wafer-engagement-shelf 330 to another wafer-engagement-shelf 330, e.g. across the plurality of wafer-engagement-shelves 330, to escape or be discharged away from between the plurality of wafer-engagement-shelves 330 of the wafer support member 300).

With reference to FIG. 3A to FIG. 3C, the support column 320 of the wafer support member 300 may include a first longitudinal end segment 323 (e.g. front segment), a second longitudinal end segment 325, and an intermediate segment 324 between the first longitudinal end segment 323 and the second longitudinal end segment 325. The first longitudinal end segment 323, the second longitudinal end segment 325 and the intermediate segment 324 may form a continuous piece of support column 320. As shown, the first longitudinal end segment 323 of the support column 320 may be a segment (e.g. front segment) of the support column 320 when the support column 320 is partitioned by a corresponding reference plane 11 extending perpendicularly (e.g. substantially perpendicularly) to the first side 321 of the support column 320 (i.e. facing the plurality of wafer-engagement-shelves 330) and the opposite second side 322 of the support column 320 (i.e. facing away from the plurality of wafer-engagement-shelves 330). The second longitudinal end segment 325 may be opposite the first longitudinal end segment 323, and may be a segment (e.g. rear segment) of the support column 320 when the support column 320 is partitioned by a corresponding reference plane 12 (e.g. parallel to the reference plane 11) extending perpendicularly (e.g. substantially perpendicularly) to the first side 321 and the opposite second side 322 of the support column 320. The intermediate segment 324 may be a middle segment of the support column 320. According to various aspects of the present disclosure, the intermediate segment 324 may be, but is not limited to being, longer (e.g. measured along a longitudinal direction or axis of the support column 320) than one or both of the first longitudinal end segment 323 and the second longitudinal end segment 325. As shown in FIGS. 3A and 3B, the second side 322 of the support column 320, along both the first longitudinal end segment 323 and the intermediate segment 324, may include or may be a flat (e.g. substantially flat) or planar or straight side (or surface). In other words, the second side 322 of the support column 320, along both the first longitudinal end segment 323 and the intermediate segment 324, may lie on or may be coincident with a same plane (e.g. a flat reference plane). That is, the second side 322 of the support column 320 at the intermediate segment 324 may be an extension of the second side 322 of the support column 320 at the first longitudinal end segment 323. On the other hand, the second side 322 of the support column 320 along the second longitudinal end segment 325 may include at least a curved side (or surface). In particular, the curved second side 322 of the support column 320 at the second longitudinal end segment 325 may be connecting or adjoining or extending from the flat second side 322 of the support column 320 at the intermediate segment 324. The second side 322 of the support column 320 at the second longitudinal end segment 325 may include (e.g. further include) a flat (e.g. substantially flat) or planar or straight side (or surface) extending from the curved second side 322 of the support column 320 at the second longitudinal end. In particular, the straight side of the support column 320 at the second longitudinal end of the support column 320 may be arranged with respect to the straight side of the support column 320 at the intermediate end to form an internal obtuse angle (i.e. between 90° and 180°, measured internally therebetween).

As shown in FIG. 3C, the support column 320 may define a plurality of drain holes 350. In particular, the plurality of drain holes 350 of the support column 320 may include at least an array of triangular-shaped through-holes 350a arranged in an isometric pattern or iso grid pattern or bi grid pattern, etc. Accordingly, the support column 320 may include an isometric grid (or bi grid) structure or frame defining the array of triangular-shaped through-holes 350a arranged in the isometric (or bi grid) pattern. As shown, the array of triangular-shaped through-holes 350a arranged in the pattern may be at or distributed across or over at least (or only) the intermediate segment 324 of the support column 320. According to various aspects of the present disclosure, the plurality of drain holes 350 may include (e.g. further include) an array of through-holes (e.g. square-shaped through-holes) 350b and/or 350c arranged in a stacked or ortho-grid (e.g. square grid) pattern, at or distributed across or over the first longitudinal end segment 323 of the support column 320 and/or across or over the second longitudinal end segment 325 (e.g. across the entire second longitudinal end segment 325, or across only the flat second side 322 of the support column 320 at the second longitudinal end segment 325). According to various other aspects of the present disclosure (not shown), the plurality of drain holes 350 may include (e.g. further include) an array of triangular-shaped through-holes, hexagonal-shaped through-holes, or through-holes of any other suitable shape (e.g. other than square-shaped through-holes), at the first longitudinal end segment 323 of the support column 320 and/or across the second longitudinal end segment 325, for respectively enabling the first longitudinal end segment 323 of the support column 320 and/or the second longitudinal end segment 325 support column 320 to be sufficiently stiff and/or rigid.

FIG. 3D shows a perspective view of the wafer support member 300 of FIG. 3A, from a second angle, according to various aspects of the present disclosure.

FIG. 3E is a close-up perspective view of a fillet element 310 of the wafer support member 300 of FIG. 3A, according to various aspects of the present disclosure.

The wafer support member 300 may include a plurality of fillet elements 310 (i.e. underside a plurality or all wafer-engagement-shelves 330) distributed across or over one or more segments (i.e. first longitudinal end segment 323, second longitudinal end segment 325, intermediate segment 324, etc.) of the support column 320. In particular, the plurality of fillet elements 310 may be distributed underside the wafer-engagement-shelves 330, along the span of the first longitudinal end segment 323 (e.g. at every underside transition joint/corner over the entire first longitudinal end segment 323) and/or along the span of the intermediate segment 324 (e.g. at every underside transition joint/corner over the entire intermediate segment 324) and/or along the span of the second longitudinal end segment 325 (e.g. at every underside transition joint/corner over the entire second longitudinal end segment 325, or at every underside transition joint/corner over a partial span of the second longitudinal end segment 325, for example, over only the span of the flat second side 322 of the support column 320 at the second longitudinal end segment 325).

FIG. 3F shows a close-up underside perspective view of the wafer support member 300 of FIG. 3A, according to various aspects of the present disclosure.

FIG. 3G shows a perspective view of the wafer support member 300 and a pair of reinforcing rods 371, 370, according to various aspects of the present disclosure.

FIG. 3H shows a close-up view of the wafer support member 300 and the pair of reinforcing rods 371, 370, of FIG. 3G, according to various aspects of the present disclosure.

FIG. 3I shows a perspective view of the wafer support member 300 of FIG. 3A, from a third angle, according to various aspects of the present disclosure.

FIG. 3J shows a perspective view of the wafer support member 300 of FIG. 3A, from a fourth angle, according to various aspects of the present disclosure.

According to various aspects of the present disclosure, the support column 320 of the wafer support member 300 may include (e.g. further include) or define a channel 360 (e.g. a passageway, which may herein be referred to as "a first channel 360", for ease of description) for or configured (e.g. sized) to receive a corresponding reinforcing rod 370 (e.g. which may herein be referred to as "a first reinforcing rod 370", for ease of description). In other words, the first reinforcing rod 370 may be insertable (e.g. completely inserted) into the first channel 360. As shown, the first channel 360 may be parallel (e.g. substantially parallel) with an axial axis of the support column 320 extending between a base and a roof of the support column 320. In other words, according to various aspects of the present disclosure, when the wafer support member 300 (or the support column 320) is in an upright/operational/use orientation, the first channel 360 may be vertically (e.g. substantially vertically) orientated. Further, as shown, the first channel 360 may be extending or arranged along or alongside or at or adjacent or within (e.g. partially or entirely within) the first longitudinal end segment 323 of the support column 320. Accordingly, the first reinforcing rod 370 inserted into the first channel 360 may straighten (e.g. further straighten) and/or reinforce and/or support and/or prevent and/or reduce an extent of at least the first longitudinal end segment 323 of the support column 320 from any flexing or bending.

According to various aspects of the present disclosure, the support column 320 of the wafer support member 300 may include (e.g. further include) or define a channel 363 (e.g. a passageway, which may herein be referred to as "a second channel 363", for ease of description) which may be sized and/or configured identically or similarly as the first channel 360. Accordingly, the second channel 363 may be configured to receive a corresponding reinforcing rod (e.g. which may herein be referred to as "a second reinforcing rod", for ease of description). As shown, the second channel 363 (or a hole axis of the second channel 363) may parallel (e.g. substantially parallel) with the axial axis of the support column 320 and/or with the first channel 360 (e.g. with a hole axis of the first channel 360). Further, the second channel 363 may be extending or arranged along or alongside or at or adjacent or within (e.g. partially or entirely within) the second longitudinal end segment 325 of the support column 320 (i.e. opposite the first longitudinal end segment 323).

With reference to FIG. 3F, according to various aspects of the present disclosure, each of the first channel 360 and the second channel 363 may include, but is not limited to including, a respective channel opening 361, 364 at the base of the support column 320 (or the wafer support member 300). Thus, according to various other aspects of the present disclosure (not shown), any one or both the first channel 360 and the second channel 363 may (e.g. additionally or alternatively) include a respective channel opening at the roof of the support column 320 (or the wafer support member 300). As an example, according to various aspects of the present disclosure, each of the first channel 360 and the second channel 363 may be sized, but is not limited, with a diameter (e.g. uniform diameter) within a range of between approximately 5 mm to approximately 10 mm (e.g. approximately 8 mm) to receive a corresponding reinforcing rod (e.g. with a rod diameter smaller than the channel diameter for a loose-fit between the channel and the rod, or with a rod diameter identical or larger than the channel diameter for a snug-fit between the channel and the rod).

According to various aspects of the present disclosure, the wafer support member 300 may include at least one or both of the first reinforcing rod 370 and the second reinforcing rod (e.g. inserted or disposed within at least one or both of the first channel 360 and the second channel 363, respectively). According to various aspects of the present disclosure, one or both the first reinforcing rod 370 and the second reinforcing rod may be made of a different material (e.g. a more rigid and/or harder material) than/from a material of the support column 320 (or the entire wafer support member 300). For example, one or both the first reinforcing rod 370 and the second reinforcing rod may include or may be made of a metal or metallic material, or a carbon or carbon fiber material, while the support column 320 may include or may be made of a polymer material. According to various other aspects of the present disclosure, one or both the first reinforcing rod 370 and the second reinforcing rod may be made of a same material as the support column 320 (or the entire wafer support member 300). Further, according to various other aspects of the present disclosure, one or both the first reinforcing rod 370 and the second reinforcing rod may be integrally molded or integrally printed with the support column 320 (e.g. via an additive manufacturing process or 3-Dimensional printing process).

With reference to FIG. 3F, the wafer support member 300 may include (e.g. optionally/further include) a first rod-securing member 373 configured to or for securing the first reinforcing rod 370 within the first channel 360 (e.g. when the first reinforcing rod 370 is not integrally molded or integrally printed with the support column 320). The wafer support member 300 may include (e.g. optionally/further include) a second rod securing member configured to or for securing the second reinforcing rod within the second channel 363. For example, as shown in FIG. 3F, each rod-securing member 373 may be a cantilever arm 373a (e.g. 3-Dimensional printed cantilever arm) arranged and/or configured to urge the respective reinforcing rod against an edge (e.g. side edge) of the respective channel 360, 363 (e.g. edge of the support column 320 defining the respective channel 360, 363). In particular, a free end of the cantilever arm 373a may coincide or intersect a hole-axis of the respective channel, while an opposite end of the cantilever arm 373a may be affixed (e.g. integrally molded or integrally printed) onto the support column 320 (e.g. to the base of the support column 320).

FIG. 3K shows a close-up partial view of a reinforcing arrangement 380 of the wafer support member 300, from a first angle, according to various aspects of the present disclosure.

FIG. 3L shows a close-up partial view of the reinforcing arrangement 380 of the wafer support member 300, from a second angle, according to various aspects of the present disclosure.

FIG. 3M shows a top cross-sectional view of the wafer support member 300, showing the reinforcing arrangement 380 of FIG. 3K, according to various aspects of the present disclosure.

With reference to FIG. 3K to FIG. 3M, the support column 320 of the wafer support member 300 may include a reinforcing arrangement 380 for providing one or more or all segments of the wafer support member 300 with structural rigidity. Particularly, the reinforcing arrangement 380 may be configured to increase stiffness and/or rigidity of at least a segment or portion of the wafer support member 300.

For example, as shown in FIG. 3K to FIG. 3M, according to various aspects of the present disclosure, the reinforcing arrangement 380 may be disposed or located at or within the second longitudinal end segment 325 of the support column 320. In particular, the reinforcing arrangement 380 may be at or along or alongside and/or distributed across the curved side of the support column 320 at the second longitudinal end segment 325.

As shown, in particular, the reinforcing arrangement 380 may include at least a plurality of circular-shaped (e.g. ellipse-shaped) reinforcing ribs 385 (e.g. each having a rib thickness of approximately 1.8 mm), extending substantially perpendicularly to the hole axis of the second channel 363.

Herein, for ease of illustration, the reinforcing arrangement 380 may be described with reference to ellipse-shaped reinforcing ribs 385. Nevertheless, it is understood that the reinforcing arrangement 380 is not limited thereto. Thus, for example, the reinforcing arrangement 380 may include any other suitable circular-shaped reinforcing ribs, and description herein with reference to ellipse-shaped reinforcing ribs 385 may apply to the other suitable circular-shaped reinforcing ribs.

Further, as shown, the plurality of ellipse-shaped reinforcing ribs 385 may be arranged end-to-end, at or along a first flank of the second channel 363, along a direction substantially parallel with the hole axis of the second channel 363. In other words, the reinforcing arrangement 380 may include a series (e.g. a column) of ellipse-shaped reinforcing ribs 385. According to various aspects of the present disclosure, a pair of opposite ends or points (e.g. at the co-vertexes) of each ellipse-shaped reinforcing rib 385 may be aligned (e.g. horizontally aligned) with a respective pair of wafer-engagement-shelves 330 of the plurality of wafer-engagement-shelves 330. In other words, the pair of opposite ends (e.g. pair of co-vertexes) of each ellipse-shaped reinforcing rib 385 may be lying on or along (in other words, coincident with) a plane (e.g. transverse plane or horizontal plane) of a respective pair of wafer-engagement-shelves 330. The respective pair of wafer-engagement-shelves 330 may be sandwiching or interposing one or more other wafer-engagement-shelves 330 of the wafer support member 300. For example, when the respective pair of wafer-engagement-shelves 330 are interposing 3 other wafer-engagement-shelves 330, and when the plurality of wafer-engagement-shelves 330 of the wafer support member 300 are spaced from each other at regular intervals (e.g. with a pitch of approximately 10 mm), a height of each ellipse-shaped reinforcing rib 385 (e.g. measured between the pair of co-vertexes of the ellipse-shaped reinforcing rib 385) may be equal to approximately 40 mm (i.e. the approximate height of 5 wafer-engagement-shelves 330). As such, the plurality of ellipse-shaped reinforcing ribs 385 (or end points, e.g. co-vertexes) may be aligned and/or intersecting and/or adjoining one or more intersection joints/corners of the wafer support member 300 (e.g. between parts of the wafer support member 300). According to various aspects of the present disclosure, each ellipse-shaped reinforcing rib 385 (in particular, the ellipse shape of each rib 385) may be, but is not limited to being, elongate in a direction perpendicular (e.g. substantially perpendicular) to the hole axis of the second channel 363. Further, as shown, each ellipse-shaped reinforcing rib 385 may define, but is not limited to defining, a through-hole between extending into the first side 321 of the support column 320.

The reinforcing arrangement 380 may further include a first arrangement of at least one linear reinforcing rib 381 (e.g. each having a rib thickness of approximately 1.8 mm) extending between a pair of opposite ends (e.g. pair of co-vertexes) of each ellipse-shaped reinforcing rib 385 along the direction substantially parallel with the hole axis of the second channel 363, at or along the first flank of the second channel 363. In other words, each rib of the first arrangement of at least one linear reinforcing rib 381 may be vertically-orientated (e.g. when the wafer support member 300 is in an upright orientation).

The reinforcing arrangement 380 may include (e.g. further include) a second arrangement of at least one linear reinforcing rib 382 (e.g. each having a rib thickness of approximately 1.8 mm) extending between another pair of opposite ends (e.g. pair of vertexes) of each ellipse-shaped reinforcing rib 385. Each rib of the second arrangement of at least one linear reinforcing rib 382 may be horizontally-orientated (e.g. when the wafer support member 300 is in an upright orientation). Accordingly, when the reinforcing arrangement 380 includes both the first arrangement of at least one linear reinforcing rib 381 and the second arrangement of at least one linear reinforcing rib 382, the first arrangement of at least one linear reinforcing rib 381 and the second arrangement of at least one linear reinforcing rib 382 may intersect each other in a substantially perpendicular manner, within each ellipse-shaped rib 385, to form a crucifix-shaped or cross-shaped reinforcing sub-arrangement 384 encircled within each ellipse-shaped rib 385.

With reference to FIG. 3M, according to various aspects of the present disclosure, the reinforcing arrangement 380 may include (e.g. further include) a third arrangement of at least one linear reinforcing rib 383 (e.g. each having a rib thickness of approximately 1.8 mm) aligned parallel (e.g. substantially parallel) with the first arrangement of at least one linear reinforcing rib 381 at or along a second flank of the second channel 363. The second flank of the second channel 363 may be opposite (e.g. substantially opposite or directly/immediately opposite) the first flank of the second channel 363. According to various aspects of the present disclosure, an exposed end (e.g. exposed longitudinal end) of each linear reinforcing rib of the third arrangement 383 may be configured or may serve as or may be a wafer stopper (e.g. backstop) or part of a wafer stopper (e.g. middle or center portion/segment of a wafer stopper of the wafer support member 300) configured to or for preventing a wafer disk on a respective wafer-engagement-shelf 330 from moving past the wafer stopper in a direction (e.g. rearward direction) from the first longitudinal end segment 323 towards the second longitudinal end segment 325. In particular, according to various aspects of the present disclosure, each linear reinforcing rib of the third arrangement 383 may be configured to abut a point, along an edge (e.g. side edge), of a wafer disk on a corresponding wafer-engagement-shelf 330. Accordingly, according to various aspects of the present disclosure, the wafer support member 300 may include a wafer stopper (e.g. between each pair of neighbouring wafer-engagement-shelves 330, at a rear of the wafer-support member/at the second longitudinal end) configured to or for abutting against or physically contacting a wafer disk. An opposite longitudinal end of each linear reinforcing rib, i.e. immediately adjacent to the second channel 363, may be adjoined to or may meet an edge (e.g. side edge/rim) of the second channel 363.

According to various aspects of the present disclosure, the edge (e.g. side edge/rim) of one or both of the first channel 360 and/or the second channel 363 may be reinforced by at least one border wall 386 (e.g. thick border wall, reinforcing flange, half-pipe/half-pipe wall, etc.). According to various aspects of the present disclosure, the at least one border wall 386 may be an arch-shaped border wall 386 (e.g. having a similar or identical radius or curvature as the edge (e.g. side edge) of the respective channel 360, 363, encircling the first channel 360 and/or the second channel 363 at the edge (e.g. side edge/rim) of the first channel 360 and/or the second channel 363. Further, as shown, the at least one border wall 386 may be, but is not limited to being, at least two border walls 386 (e.g. discrete/independent/separate/spaced apart border walls 386) disposed at opposite ends (e.g. substantially opposite ends, such as at the first flank and the opposite second flank) of the respective channel 360, 363. According to various other aspects of the present disclosure (not shown), the at least one border wall 386 may be a single, continuous wall encircling or surrounding the respective channel 360, 363 (e.g. entire perimeter or circumference of the respective channel 360, 363). According to various aspects of the present disclosure, when the wafer support member 300 includes the first arrangement of at least one linear reinforcing rib 381 and/or the third arrangement of at least one linear reinforcing rib 383, at least one border wall 386 may be adjoining one or both the first arrangement of at least one linear reinforcing rib 381 and/or the third arrangement of at least one linear reinforcing rib 383, specifically, at the longitudinal end (i.e. of each rib 381, 383) immediately adjacent to the second channel 363 (e.g. so as to form a T-shaped or substantially T-shaped lateral cross-section/profile, or half-pipe cross-section/profile).

Referring to FIG. 3M, as well as back to FIG. 3A to FIG. 3C, the wafer support member 300 may include (e.g. further include) at least one (e.g. one, two, three, etc.) reinforcing stiffener 387 (e.g. a reinforcing plate) embedded within the support column 320 and/or extending perpendicularly (e.g. substantially perpendicularly) from the second side 322 of the support column 320 (i.e. facing away from the plurality of wafer-engagement-shelves 330). Each reinforcing stiffener 387 may be extending along an entire or more than half the entire height of the support column 320, measured from the base to the roof of the support column 320. According to various aspects of the present disclosure, the one or more reinforcing stiffener(s) 387 may help straighten or contribute to straightening the wafer support member 300 at one or more segments where the reinforcing stiffener(s) 387 are located. As an example, as shown in FIG. 3A, the wafer support member 300 may include a plurality (e.g. 3) reinforcing stiffeners 387 at and/or alongside the first longitudinal end segment 323 of the support column 320 (e.g. embedded within and/or extending from the second side 322 of the support column 320 at the first longitudinal end segment 323). As another example, with reference to FIG. 3K, the wafer support member 300 may include (e.g. further include) a plurality (e.g. 3) reinforcing stiffeners 387 at the second longitudinal end segment 325 of the support column 320 (e.g. embedded within the support column 320 at the second longitudinal end segment 325).

FIG. 3N shows a close-up top view of a securing element 392a of the wafer support member 300 at a front of the wafer support member 300, according to various aspects of the present disclosure.

FIG. 3O shows a close-up side view of the securing element 392a of FIG. 3N, according to various aspects of the present disclosure.

FIG. 3P shows a close-up perspective view of a securing element 392b of the wafer support member 300 at a rear of the wafer support member 300, according to various aspects of the present disclosure.

FIG. 3Q shows a close-up perspective view of the securing element 392b of FIG. 3P, according to various aspects of the present disclosure.

With reference to FIG. 3A, FIG. 3N and FIG. 3O, the wafer support member 300 may include at least one securing element 392 for inter-engaging or inter-mating or interlocking with a corresponding securing element of a wafer container (e.g. FOUP).

As shown, according to various aspects of the present disclosure, each securing element 392 of the wafer support member 300 may be or may include a tongue member (or protrusion member, or tab, etc.) protruding or extending from a roof of the support column 320.

Accordingly, the corresponding securing element of the wafer container may be or may include at least one slot (e.g. formed by at least one corresponding pair of plates) for receiving the at least one tongue member of the wafer support member 300. In particular, the at least one slot of the wafer container may be arranged to facilitate (e.g. guide) insertion of the wafer support member 300 into (e.g. linearly into) an inner space of the wafer container for the wafer support member 300. That is, the at least one slot of the wafer container may limit any side-by-side or lateral movement of the wafer support member 300, within the wafer container, while the wafer support member 300 is inserted into the inner space of the wafer container.

As shown in FIG. 3N and FIG. 3O, the securing element 392 (e.g. at least the securing element 392a at the front) of the wafer support member 300 may further include (e.g. further include) a reinforcing gusset 395 configured to reinforce or support the securing element 392. For example, as shown, when the securing element 392 is or includes a tab, the reinforcing gusset 395 may be arranged in a manner to minimize any bending or flexing of the tab or to prevent the tab from breaking.

FIG. 3R shows a close-up partial view of a surface-enhancement element 393 of the wafer support member 300, according to various aspects of the present disclosure.

According to various aspects of the present disclosure, the wafer support member 300 may include a surface-enhancement element 393 along or distributed across one or more or every flat (e.g. substantially flat) or planar vertical surface of the wafer support member 300 (e.g. when the wafer support member 300 is in an upright orientation).

As shown, according to various aspects of the present disclosure, the surface-enhancement element 393 may include or may be, but is not limited to, a plurality of protruding structures (e.g. bumps) on a corresponding flat vertical surface of the wafer support member 300.

Further, as shown, the plurality of protruding structures may be arranged, but is not limited to being arranged, in a regular/repeating pattern.

Further, the surface-enhancement element 393 (e.g. protrusions) may be integrally printed or molded with the corresponding flat vertical surface of the wafer support structure. As such, the printer (i.e. additive manufacturing printer or 3-Dimensional printer) may put more focus in trying to resolve that geometry (i.e. flat vertical flat surface) during the printing operation, thereby resolving or improving manufacturability/appearance of at least the flat vertical surface(s) of the wafer support member 300. That is, the surface-enhancement element 393 may prevent (in other words, address) any potential "elephant skin" effect or other issues (e.g. potential surface defects) in printing or manufacturing the flat vertical surface(s) of the wafer support structure (e.g. via an additive manufacturing process or 3-Dimensional printing process).

FIG. 3S shows a close-up partial view of a variant surface-enhancement element 394 of the wafer support member 300, according to various aspects of the present disclosure.

As shown, the variant surface-enhancement element 394 may include or may be a fin (e.g. protruding fin) extending (e.g. inwardly) from an inner wall of the support column 320 defining one or more or every drain hole 350 (e.g. of all square-shaped drain hole(s)).

As an example, the variant surface-enhancement element 394 may be a continuous fin extending around a hole axis of a corresponding square-shaped drain hole 350.

According to various aspects of the present disclosure, there may be provided a method of manufacturing a wafer support member 100, 200, or 300, according to various aspects of the present disclosure.

According to various aspects of the present disclosure, the method may include providing a powder material (e.g. additive manufacturing powder).

According to various aspects of the present disclosure, the method may include (e.g. further include) sequentially forming a layer of material (e.g. on a substrate), using the powder material (e.g. by melting the powder material to form the layer of material), on top of each other to form the wafer support member 100, 200, or 300.

The method may include (e.g. further include) allowing loose or remaining powder material to exit from the plurality of wafer-engagement-shelves 130, 230, or 330 of the wafer support member 100, 200, or 300 via at least the discharge ports 140 or 340 of the wafer-engagement-shelves 130, 230, or 330.

The method may include (e.g. further include) cooling the wafer support member 100, 200, or 300 (e.g. from a higher temperature to room temperature, for instance, to approximately 20° C. or 68 degrees Fahrenheit).

The method may include (e.g. further include) providing an outer shell (see, for example, reference numeral 50 in FIG. 4A and FIG. 4B) for the wafer support member 100, 200, or 300.

The method may include (e.g. further include) encasing the wafer support member 100, 200, or 300 with the outer shell 50. In particular, the method may include cooling the wafer support member 100, 200, or 300 together with the outer shell 50 encasing the wafer support member. Remaining powder material may be packed between the outer shell 50 and the wafer support member 100, 200, or 300 (e.g. such that the wafer support member may be suspended within the outer shell 50 (in other words, not in direct physical contact with the outer shell 50).

The method may include (e.g. further include) separating the outer shell 50 from the wafer support member 100, 200, or 300 (e.g. from the wafer support member 100, 200, or 300 that is cooled, or is at room temperature).

The method may include (e.g. further include) washing the wafer support member 100, 200, or 300 (e.g. cooled wafer support member 100, 200, or 300) using a washing solution (e.g. a fluid).

The method may include (e.g. further include) draining the washing solution from the wafer support member 100, 200, or 300 via (e.g. via at least) the plurality of drain holes 150 or 350 and/or the plurality of through-holes (i.e. discharge ports) 140 or 340 of the wafer support member 100, 200, or 300.

The method may include (e.g. further include) drying the wafer support member 100, 200, or 300 (e.g. after washing and/or draining the wafer support member 100, 200, or 300), or allowing the wafer support member 100, 200, or 300 to dry (e.g. over a predetermined period of time).

FIG. 4A shows a perspective view of an outer shell 50 for the wafer support structure 300, according to various aspects of the present disclosure.

FIG. 4B shows a close-up partial view of the outer shell 50 of FIG. 4A, according to various aspects of the present disclosure.

With reference to FIG. 4A and FIG. 4B, according to various aspects of the present disclosure, there may be provided the outer shell 50 for housing or containing or receiving or encasing (e.g. partially encasing or entirely encasing) the wafer support member 300 within an inner space or volume of the outer shell 50.

The outer shell 50 may function as a "build cage" around the wafer support member 300 during cooling of the wafer support member 300. In particular, the wafer support member 300 may contract when cooled (e.g. from a high temperature when it is newly printed), and the entire build space may pull away from the walls. As a result, a "build cage" (i.e. outer shell 50) may be added around the wafer support member 300 during the cooling process of the wafer support member 300, e.g. to maintain a shape/form/vertical or horizontal alignment or flatness of the wafer support member 300, by contracting together/simultaneously with the wafer support member 300.

The outer shell 50 may be easy for personnel (e.g. technician) to de-mold (e.g. since the outer shell 50 may be thin, e.g. approximately 0.3 mm thick throughout).

According to various aspects of the present disclosure, the outer shell 50 may include one or more openings for a corresponding part (e.g. the securing element 392) of the wafer support member 300 to poke through the outer shell 50 (e.g. when a build space of a 3-Dimensional printer does not permit a larger-sized outer shell 50).

According to various aspects of the present disclosure, the outer shell 50 may be printed (e.g. simultaneously printed with the wafer support member 300 via an additive manufacturing process or 3-Dimensional printing process). Accordingly, the outer shell 50 may be made of a same material as the wafer support member 300.

Various aspects may thus provide a wafer support member which may be manufacturable via an additive manufacturing process or 3-Dimensional printing process.

The wafer support member according to the various aspects may thus be relatively simple, fast and low-cost to produce or manufacture (e.g. print).

In addition, the wafer support member of the various aspects may be sufficiently rigid and/or stiff to support a weight of a plurality of wafer disks.

While the disclosure has been particularly shown and described with reference to specific aspects, it should be understood by those skilled in the art that various changes, modification, variation in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

The invention claimed is:

1. A wafer support member comprising:
   a support column; and
   a plurality of wafer-engagement-shelves extending substantially perpendicularly to the support column from a first side of the support column,
   wherein each wafer-engagement-shelf defines a plurality of through-holes extending between a base surface and an opposite wafer-engagement surface of the wafer-engagement shelf, wherein the plurality of through-holes serve as discharge ports for a plurality of loose particulates on the wafer-engagement-shelf to exit therefrom via the discharge ports,
   wherein the support column further defines a plurality of drain holes extending between the first side and an opposite second side of the support column for a fluid on the wafer-engagement-shelves to drain away therefrom via the plurality of drain holes.

2. The wafer support member of claim 1 further comprising:
   at least one fillet element between a base surface of each wafer-engagement-shelf and the first side of the support column from which the wafer-engagement-shelf extends.

3. The wafer support member of claim 2,
   wherein a fillet radius of curvature of each of the at least one fillet element is within a range of between approximately 1 mm to approximately 6 mm.

4. The wafer support member of claim 1,
   wherein the plurality of through-holes extending between the base surface and the opposite wafer-engagement surface of each wafer-engagement-shelf comprise a plurality of hexagonal-shaped through-holes arranged in a honeycomb pattern or a plurality of triangular-shaped through-holes arranged in an isometric pattern, across the wafer-engagement-shelf.

5. The wafer support member of claim 1,
   wherein the support column further comprises:
   a first channel for receiving a first reinforcing rod, wherein the first channel is disposed at a first longitudinal end segment of the support column and is parallel with an axial axis of the support column extending between a base and a roof of the support column; and
   a second channel for receiving a second reinforcing rod, wherein the second channel is disposed at a second longitudinal end segment of the support column, opposite the first longitudinal end segment, and is parallel with the axial axis of the support column.

6. The wafer support member of claim 5, wherein the support column further comprises a pair of rod-securing members configured to respectively secure the first reinforcing rod and the second reinforcing rod within the first channel and the second channel.

7. The wafer support member of claim 6, wherein the pair of rod-securing-members comprises a pair of cantilever arms configured to respectively urge the first reinforcing rod and the second reinforcing rod against a side edge of the first channel and a side edge of the second channel.

8. The wafer support member of claim 1, wherein the plurality of drain holes comprise a plurality of triangular-shaped through-holes arranged in an isometric pattern.

9. The wafer support member of claim 8, wherein the plurality of drain holes further comprise:
   a first plurality of square-shaped through-holes arranged in an ortho-grid pattern at a first longitudinal end segment of the support column; and
   a second plurality of square-shaped through-holes arranged in the ortho-grid pattern at an opposite second longitudinal end segment of the support column,
   wherein the plurality of triangular-shaped through-holes serving as drain holes are at an intermediate segment of the support column, between the first longitudinal end segment and the opposite second longitudinal end segment of the support column.

10. The wafer support member of claim 5
   wherein the support column further comprises a reinforcing arrangement at the second longitudinal end segment of the support column,
   wherein the reinforcing arrangement comprises a plurality of ellipse-shaped reinforcing ribs which are extending substantially perpendicularly to a hole axis of the second channel and which are arranged end-to-end, along a first flank of the second channel, along a direction substantially parallel with the hole axis of the second channel.

11. The wafer support member of claim 10, wherein the reinforcing arrangement further comprises:
   a first arrangement of at least one linear reinforcing rib extending between a pair of opposite ends of each ellipse-shaped reinforcing rib along the direction substantially parallel with the hole axis of the second channel, and
   a second arrangement of at least one linear reinforcing rib extending between another pair of opposite ends of each ellipse-shaped reinforcing rib, such that the second arrangement of at least one linear reinforcing rib and the first arrangement of at least one linear reinforcing rib intersect each other in a substantially perpendicular manner to form a plurality of cross-shaped reinforcing sub-arrangements respectively encircled within the plurality of ellipse-shaped reinforcing ribs.

12. The wafer support member of claim 11, wherein the reinforcing arrangement further comprises:
   a third arrangement of at least one linear reinforcing rib, aligned substantially parallel with the first arrangement of at least one reinforcing rib, along an opposite second flank of the second channel,
   wherein each linear reinforcing rib of the third arrangement of at least one linear reinforcing rib serves as a wafer-stopper for preventing a wafer disk on a respective wafer-engagement-shelf from moving past the wafer-stopper.

13. The wafer support member of claim 1,
   wherein the support column and the plurality of wafer-engagement-shelves are integrally molded or integrally printed with one another.

14. The wafer support member of claim 1, further comprising:
   a securing element for inter-engaging with a corresponding securing element of a wafer container to detachably secure the wafer support member within the wafer container.

15. A wafer support assembly comprising:
   a pair of wafer support members, wherein each wafer support member comprises:
      a support column; and
      a plurality of wafer-engagement-shelves extending substantially perpendicularly to the support column from a first side of the support column,
   wherein each wafer-engagement-shelf defines a plurality of through-holes extending between a base surface and an opposite wafer-engagement surface of the wafer-engagement shelf, wherein the plurality of through-holes serves as discharge ports for a plurality of loose particulates on the wafer-engagement-shelf to exit therefrom via the discharge ports,
   wherein the pair of wafer support members are disposed relative to each other in a manner such that the plurality of wafer-engagement-shelves of a first of the pair of wafer support members are opposing and aligned with the plurality of wafer-engagement-shelves of a second of the pair of wafer support members, so as to be capable of evenly supporting a weight of a wafer disk on each pair of opposing and aligned wafer-engagement-shelves.

16. The wafer support assembly of claim 15, further comprising:
   a wafer container,
   wherein the pair of wafer support members are disposed within an inner space of the wafer container.

17. A wafer support member comprising:
   a support column; and
   a plurality of wafer-engagement-shelves extending substantially perpendicularly to the support column from a first side of the support column,
   wherein each wafer-engagement-shelf defines a plurality of through-holes extending between a base surface and an opposite wafer-engagement surface of the wafer-engagement shelf, wherein the plurality of through-holes serve as discharge ports for a plurality of loose particulates on the wafer-engagement-shelf to exit therefrom via the discharge ports,
   wherein the plurality of through-holes extending between the base surface and the opposite wafer-engagement surface of each wafer-engagement-shelf comprise a plurality of hexagonal-shaped through-holes arranged in a honeycomb pattern or a plurality of triangular-shaped through-holes arranged in an isometric pattern, across the wafer-engagement-shelf.

18. The wafer support member of claim 17, wherein the support column further defines a plurality of drain holes extending between the first side and an opposite second side of the support column for a fluid on the wafer-engagement-shelves to drain away therefrom via the plurality of drain holes.

19. The wafer support member of claim 18, wherein the plurality of drain holes comprise a plurality of triangular-shaped through-holes arranged in an isometric pattern.

20. The wafer support member of claim 17 further comprising:
   at least one fillet element between a base surface of each wafer-engagement-shelf and the first side of the support column from which the wafer-engagement-shelf extends.

* * * * *